(12) United States Patent
Toyoda

(10) Patent No.: US 11,615,748 B2
(45) Date of Patent: Mar. 28, 2023

(54) DISPLAY DEVICE AND ELECTRONIC DEVICE

(71) Applicant: Sony Semiconductor Solutions Corporation, Kanagawa (JP)

(72) Inventor: Takashi Toyoda, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 17/289,433

(22) PCT Filed: Oct. 11, 2019

(86) PCT No.: PCT/JP2019/040180
§ 371 (c)(1),
(2) Date: Apr. 28, 2021

(87) PCT Pub. No.: WO2020/105310
PCT Pub. Date: May 28, 2020

(65) Prior Publication Data
US 2021/0398487 A1  Dec. 23, 2021

(30) Foreign Application Priority Data

Nov. 21, 2018 (JP) .............................. JP2018-217855

(51) Int. Cl.
*G09G 3/3258* (2016.01)
*G09G 3/3233* (2016.01)

(52) U.S. Cl.
CPC ......... *G09G 3/3258* (2013.01); *G09G 3/3233* (2013.01); *G09G 2300/0809* (2013.01);
(Continued)

(58) Field of Classification Search
CPC ............... G09G 3/3258; G09G 3/3233; G09G 2300/0809; G09G 2300/0819;
(Continued)

(56) References Cited

U.S. PATENT DOCUMENTS

| 2003/0103022 A1 | 6/2003 | Noguchi et al. | |
|---|---|---|---|
| 2006/0066512 A1* | 3/2006 | Afentakis | G09G 3/20 |
| | | | 345/55 |

(Continued)

FOREIGN PATENT DOCUMENTS

| CN | 103198785 A | 7/2013 |
|---|---|---|
| JP | 2003-150105 A | 5/2003 |

(Continued)

OTHER PUBLICATIONS

International Search Report (PCT/ISA/210), International Application No. PCT/JP2019/040180, dated Dec. 6, 2019.

(Continued)

*Primary Examiner* — Tom V Sheng
(74) *Attorney, Agent, or Firm* — Michael Best & Friedrich LLP

(57) ABSTRACT

A display device includes a pixel array unit in which display elements constituting pixels are arranged in a two-dimensional matrix in a row direction and a column direction. Each of the display elements includes a current-driven light-emitting unit and a drive circuit for driving the light-emitting unit. The drive circuit includes at least a write transistor for writing a video signal and a drive transistor for applying current to the light-emitting unit. A voltage is supplied to a back gate of at least the write transistor via a back gate line provided separate from a power supply line that supplies a voltage to the drive transistor.

15 Claims, 23 Drawing Sheets

(52) U.S. Cl.
CPC ............... *G09G 2300/0819* (2013.01); *G09G 2300/0866* (2013.01); *G09G 2320/0219* (2013.01); *G09G 2320/0233* (2013.01); *G09G 2320/0238* (2013.01); *G09G 2320/043* (2013.01); *G09G 2320/045* (2013.01); *G09G 2330/021* (2013.01)

(58) Field of Classification Search
CPC ... G09G 2300/0866; G09G 2320/0219; G09G 2320/0238; G09G 2320/0233; G09G 2320/043; G09G 2320/045; G09G 2330/021
USPC .......................................................... 345/212
See application file for complete search history.

(56) References Cited

U.S. PATENT DOCUMENTS

| | | | | |
|---|---|---|---|---|
| 2015/0084946 | A1* | 3/2015 | Shim | G09G 3/3233 345/212 |
| 2017/0337874 | A1* | 11/2017 | Toyomura | G09G 3/3258 |
| 2020/0135091 | A1* | 4/2020 | Kim | G09G 3/32 |
| 2020/0143741 | A1* | 5/2020 | Tsuboi | G09G 3/3233 |
| 2021/0090502 | A1* | 3/2021 | Choi | G09G 3/3233 |

FOREIGN PATENT DOCUMENTS

| | | |
|---|---|---|
| JP | 2012-255875 A | 12/2012 |
| JP | 2015187672 A | 10/2015 |
| WO | 2016/072140 A1 | 5/2016 |

OTHER PUBLICATIONS

Notification of Transmittal of the International Search Report and the Written Opinion of the International Searching Authority, or the Declaration (PCT/ISA/220), international Application No. PCT/JP2019/040180, dated Dec. 17, 2019.

Written Opinion of the International Search Authority (PCT/ISA/237), International Application No. PCT/JP2019/040180, dated Dec. 17, 2019.

* cited by examiner

Fig. 20
Fig. 20A
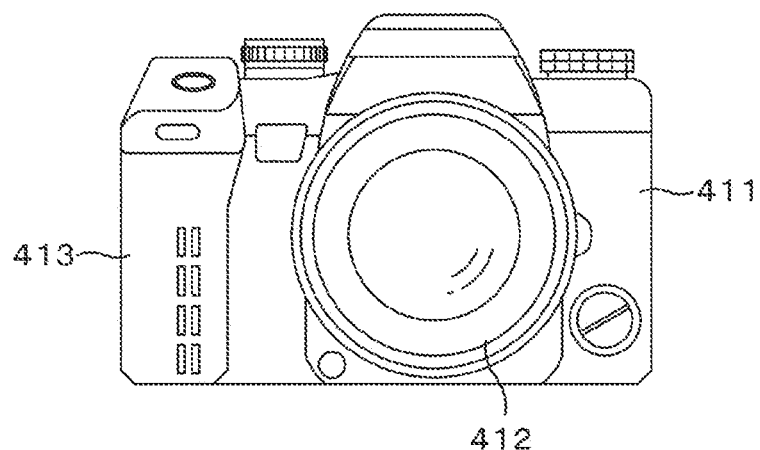
Fig. 20B
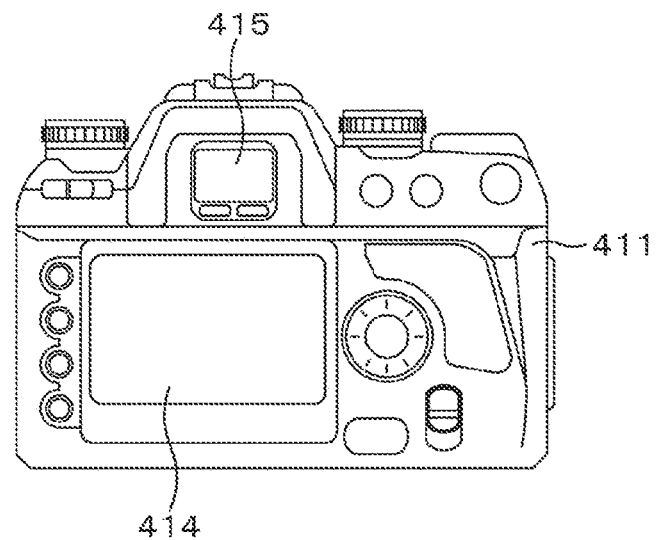

DISPLAY DEVICE AND ELECTRONIC DEVICE

TECHNICAL FIELD

The present disclosure relates to a display device and an electronic device.

BACKGROUND ART

Display elements including current-driven light-emitting units and display devices including such display elements are well-known. For example, display elements including light-emitting units constituted by organic electroluminescence elements are attracting attention as display elements capable of emitting light at high luminance through low-voltage current driving.

A display device which uses organic electroluminescence is selfluminous, and furthermore has responsiveness sufficient for high-definition, high-speed video signals. For example, a display device to be attached to eyewear such as glasses or goggles requires a pixel size of approximately several micrometers to 10 micrometers. A display element driven using the active-matrix technique includes light-emitting units constituted by organic layers including a light-emitting layer and the like, as well as a drive circuit for driving the light-emitting units.

A drive circuit constituted by a transistor and a capacitance unit is well-known as a circuit for driving a current-driven light-emitting unit (see PTL 1, for example). FIG. 23 illustrates an example of a circuit configuration of a pixel located in an mth row and an nth column of a display device including, as pixels, display elements in which drive circuits are configured using p-channel transistors.

A drive circuit 71 in a pixel 70 includes a drive transistor $TR_D$, a write transistor $TR_W$, and a capacitance unit $C_S$. A light-emitting unit ELP emits light at a luminance based on a value of current flowing. The current flowing in the light-emitting unit ELP is controlled by a gate-source voltage of the drive transistor $TR_D$.

The write transistor $TR_W$ enters a conductive state in response to a scanning pulse (where a low voltage is in an active state) supplied from a vertical scanner 120 over a scanning line $WS_m$. When the write transistor $TR_W$ enters the conductive state, a video signal voltage $V_{Sig}$ supplied from a source driver 110 to a signal line $DTL_n$ is written to the pixel 70.

The capacitance unit $C_S$ is connected between a gate electrode and a source electrode of the drive transistor $TR_D$. A power source voltage $V_{CC}$ is applied to the source electrode of the drive transistor $TR_D$ from a power source unit 130 via a power supply line $PS1_m$, and the video signal voltage $V_{Sig}$ is supplied to the gate electrode. As a result, the capacitance unit $C_S$ holds a voltage ($V_{CC}$-$V_{Sig}$) as the gate-source voltage of the drive transistor $TR_D$. A drain current $I_{ds}$, expressed by the following Equation (1), flows in the drive transistor $TP_D$, and the light-emitting unit ELP emits light at a luminance based on the current value.

$$I_{ds}=k\cdot\mu\cdot((V_{CC}\cdot V_{Sig})-|V_{th}|)^2 \quad (1)$$

wherein μ: effective mobility
L: channel length
W: channel width
$V_{th}$: threshold voltage
$C_{ox}$: (relative dielectric constant of gate insulating layer)× (dielectric constant of vacuum)/(thickness of gate insulating layer)
$k=(½)\cdot(W/L)\cdot C_{ox}$ When, for example, the drive transistor $TR_D$ is a p-channel type, to achieve black tones, it is necessary to apply a voltage equal to or greater than the source electrode-side voltage (the power source voltage $V_{CC}$, in the example of FIG. 23) to the gate electrode of the drive transistor $TR_D$ and sufficiently suppress leakage current in the drive transistor $TR_D$.

CITATION LIST

Patent Literature

PTL 1

JP 2015-187672 A

SUMMARY

Technical Problem

When the transistor constituting the drive circuit is a p-channel transistor, a configuration is often used in which the power source voltage $V_{CC}$, which is the highest fixed potential supplied to the display device, is supplied as a back gate voltage of the transistor. In this case, from the standpoint of reducing the number of interconnects and the like, it is convenient to use a configuration in which the power source voltage $V_{CC}$ is supplied as the back gate voltage over a power supply line PS1.

However, current flows in the power supply line PS1 in accordance with the emission of light by the display element constituting the pixel. Additionally, the amount of current flowing in the power supply line PS1 varies depending on the light emission states of the plurality of pixels connected to the power supply line PS1. It is therefore conceivable that the back gate voltage of the transistor will fluctuate in accordance with the emission of light by the display element as a result. In particular, fluctuation in the back gate voltage of a write transistor affects leakage of the charge held in the capacitance unit $C_S$, which can also act as a factor that reduces the display quality.

Accordingly, an object of the present disclosure is to provide a display device capable of favorably holding a back gate voltage regardless of a light emission state of a display element constituting a pixel, as well as an electronic device including the stated display device.

Solution to Problem

A display device according to the present disclosure for achieving the above-described object is a display device including a pixel array unit in which display elements constituting pixels are arranged in a two-dimensional matrix in a row direction and a column direction, wherein each of the display elements includes a current-driven light-emitting unit and a drive circuit for driving the light-emitting unit, the drive circuit includes at least a write transistor for writing a video signal and a drive transistor for applying current to the light-emitting unit, and a voltage is supplied to a back gate of at least the write transistor via a back gate line provided separate from a power supply line that supplies a voltage to the drive transistor.

An electronic device according to the present disclosure for achieving the above-described object is an electronic device including a display device, the display device including:

a pixel array unit in which display elements constituting pixels are arranged in a two-dimensional matrix in a row direction and a column direction, wherein each of the display elements includes a current-driven light-emitting unit and a drive circuit for driving the light-emitting unit, the drive circuit includes at least a write transistor for writing a video signal and a drive transistor for applying current to the light-emitting unit, and a voltage is supplied to a back gate of at least the write transistor via a back gate line provided separate from a power supply line that supplies a voltage to the drive transistor.

BRIEF DESCRIPTION OF DRAWINGS

FIG. 10 is a schematic circuit diagram, continuing from. FIG. 9, for illustrating a supply path of back gate voltage in the display device according to the first embodiment.

FIG. 20 is an exterior view of an interchangeable-lens single-lens reflex-type digital still camera, where FIG. 20A illustrates a front view thereof, and FIG. 20B illustrates a rear view thereof.

DESCRIPTION OF EMBODIMENTS

Figure 1:
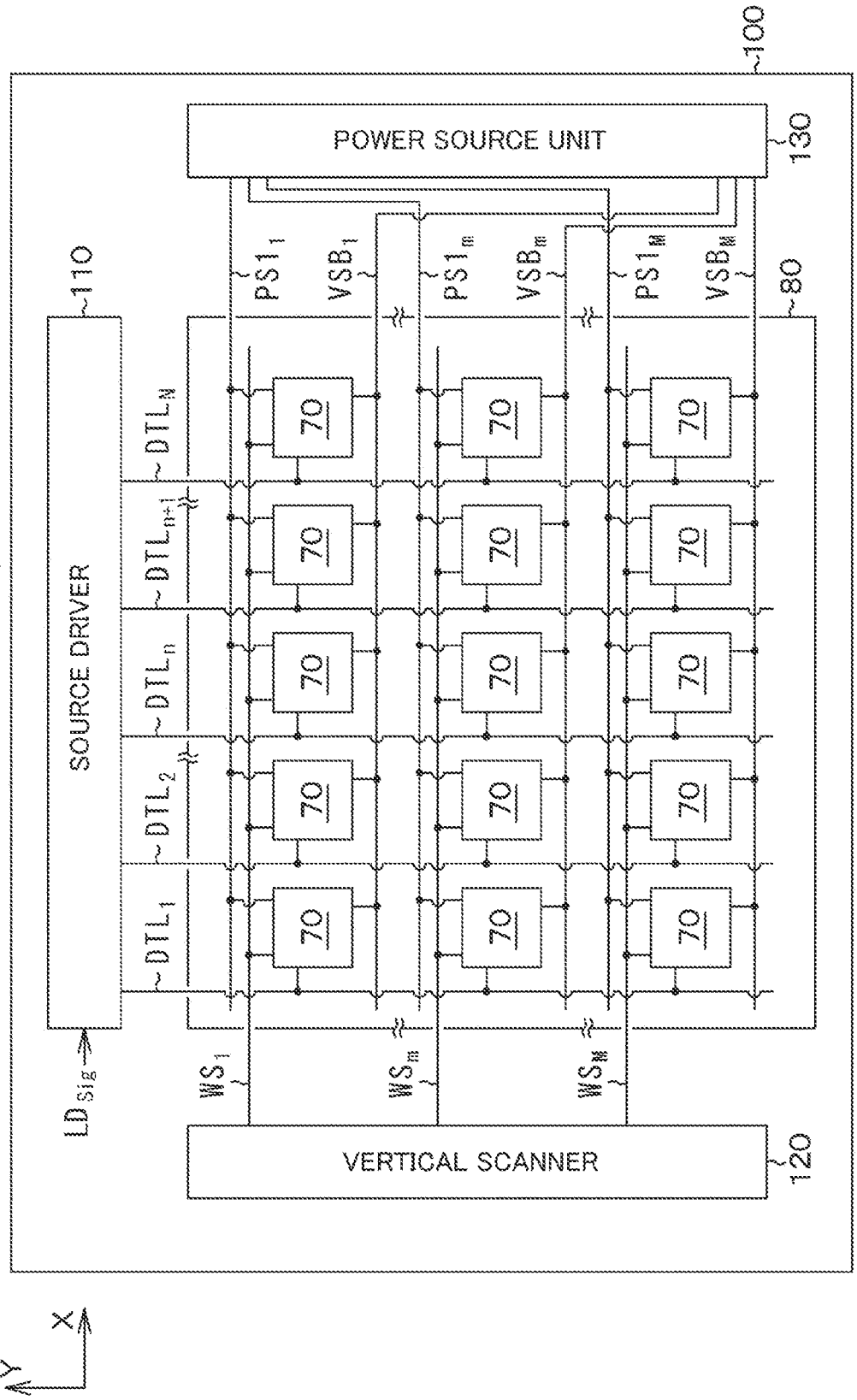
FIG. 1 is a conceptual diagram of a display device according to a first embodiment.

The present disclosure will be described below on the basis of embodiments, with reference to the drawings. The present disclosure is not intended to be limited to the embodiments, and the various numerical values, materials, and the like in the embodiments are merely examples. In the following descriptions, identical reference signs will be used for identical elements or elements having identical functions, and redundant descriptions thereof will not; be given. Note that the descriptions will be given in the following order.

1. Overall Descriptions of Display Device and Electronic Device According to Present Disclosure
2. First Embodiment
3. Second Embodiment
4. Variations on Drive Circuit
5. Description of Electronic Device, Etc.

[Overall Descriptions of Display Device and Electronic Device According to Present Disclosure]

As described above, a display device according to the present disclosure, and a display device used in an electronic device according to the present disclosure (these may be called simply a "display device according to the present disclosure" hereinafter), include a pixel array unit in which display elements constituting pixels are arranged in a two-dimensional matrix in a row direction and a column direction. Each of the display elements includes a current-driven light-emitting unit and a drive circuit for driving the light-emitting unit. The drive circuit includes at least a write transistor for writing a video signal and a drive transistor for applying current to the light-emitting unit. A voltage is supplied to a back gate of at least the write transistor via a back gate line provided separate from a power supply line that supplies a voltage to the drive transistor.

In the display device according to the present disclosure, a configuration can be employed in which a constant voltage is supplied to the back gate line.

In a display device of the present disclosure including the above-described preferred configuration, a configuration can be employed in which the write transistor is constituted by a p-channel transistor, and a same voltage as, or a different voltage from, the voltage supplied to the power supply line is supplied to the back gate line.

In this case, a configuration can be employed in which a voltage from a shared power source unit is supplied to the power supply line and the back gate line. This configuration has the advantage of simplifying the configuration of the display device. The shared power source unit may be provided within the display device, or provided outside the display device.

Alternatively, in this case, a configuration can be employed in which a voltage from a power source unit corresponding to the power supply line is supplied to the power supply line, and a voltage from a power source unit different from the power source unit corresponding to the power supply line is supplied to the back gate line. This configuration provides an advantage in that the voltage supplied to the back gate line can be stabilized. In this case too, each shared power source unit may be provided within the display device, or provided outside the display device.

Alternatively, in the display device according to the present disclosure, a configuration can be employed. In which a voltage that changes in accordance with scanning of the display element is supplied to the back gate line. In this case, a configuration can be employed in which a voltage that is the same as a voltage supplied to a scanning line connected to a gate electrode of the write transistor is supplied to the back gate line.

In a display device of the present disclosure including the various above-described preferred configurations, a configuration can be employed in which the drive circuit includes two types of transistors having different conductivity types, and a back gate line for at least a transistor of the conductivity type constituting the write transistor is provided.

In this case, a configuration can be employed in which a back gate line corresponding to each of the two types of transistors is provided.

An organic electroluminescence element, an LED element, a semiconductor laser element, or the like can be used as the current-driven light-emitting unit used in a display device of the present disclosure including the various above-described preferred configurations. These elements can be configured using well-known materials, methods, and so on. Among such elements, from the standpoint of configuring a flat display device, the light-emitting unit is preferably constituted by an organic electroluminescence light-emitting unit.

Hereinafter, the display device, the electronic device, and the like according to the present disclosure may simply be called the present disclosure. In the present disclosure, the drive circuit can be formed on a semiconductor substrate, an insulating substrate on which a semiconductor material layer is formed, or the like. When the drive circuit is constituted by transistors formed on a semiconductor substrate, a configuration may be employed in which, for example, a well region is provided on a semiconductor substrate constituted by silicon, and transistors are formed in the well.

The conductivity type of the transistors that constitute the drive circuit is not particularly limited. For example, a configuration can be employed in which the write transistor, the drive transistor, and the like are constituted by p-channel transistors. In this case, the pixel emits light when a low-level voltage is applied to a gate of the drive transistor. The pixel is extinguished when a sufficiently high-level voltage is applied to the gate. In the following descriptions, a state in which a signal voltage corresponding to the display of the highest luminance according to the specifications of the display device is written to a pixel may be called a "white display", and a state in which a signal voltage corresponding to the display of the lowest luminance according to the specifications is written to a pixel may be called a "black display".

The various types of interconnects used in the display device can be formed, for example, by a combination of well-known deposition methods, such as, for example, physical vapor deposition (PVD) exemplified by vacuum deposition and sputtering and various types of chemical vapor deposition (CVD) methods, as well as well-known patterning methods such as etching and lift-off.

A source driver and the like that drive the display device may be integrated and configured as an integral part of the semiconductor substrate or the like on which the display elements are disposed, or may be configured as a separate entities as appropriate. These can be configured using well-known circuit elements. For example, the vertical scanner and the power source unit illustrated in FIG. 1 can also be configured using well-known circuit elements. For applications that require smaller sizes, such as display devices for head-mounted displays and viewfinders, it is preferable to employ a configuration in which the display element and the driver are formed on the same semiconductor substrate or the like.

The display device may be configured for so-called monochromatic display, or may be configured for color display. When the display device is configured for color display, a configuration can be employed in which a single color pixel is constituted by a plurality of pixels, specifically, a single color pixel is constituted by a set including a red display pixel, a green display pixel, and a blue display pixel. Furthermore, a single color pixel can be constituted by a set of these three types of pixels plus one or more additional types of pixels.

Several resolutions for image display, such as (3840, 2160) and (7680, 4320), as well as U-XGA (1600, 1200), HD-TV (1920, 1080), and Q-XGA (2048, 1586), can be given as examples of values of the pixels in the display device, but the values are not limited to these values.

Additionally, various types of electronic devices provided with image display functions, as well as direct view-type and projection-type display devices, can be given as examples of electronic devices including the display device according to the present disclosure.

The various conditions in the present specification are satisfied when holding true in a strict mathematical sense, as well as when holding true in substance. Various types of variations in terms of design and manufacturing are permitted to be present. Additionally, each drawing used in the following descriptions is schematic and does not represent actual dimensions, the proportions thereof, and so on. For example, FIG. 3, described later, illustrates the cross-sectional. structure of the display device, but does not indicate the proportions of width, height, thickness, and so on.

First Embodiment

A first embodiment pertains to a display device and an electronic device according to the present disclosure.

FIG. 1 is a conceptual diagram of the display device according to a first embodiment.

An overview of the display device will be given. A display device 1 includes a pixel array unit 80 in which display elements 70 constituting pixels are arranged in a two-dimensional matrix, in a row direction and a column direction. The display device 1 also includes scanning lines WS, power supply lines PS1, and back gate lines VSB, which are provided for each of pixel rows arranged following the row direction (the X direction, in FIG. 1), as well as data lines DTL, which are provided for each of pixel columns arranged following the column direction (the Y direction, in FIG. 1).

The display elements 70 are arranged in the two-dimensional matrix, with N elements in the row direction and M elements in the column direction, for a total of N×M elements, with the display elements 70 connected to the scanning lines WS, the power supply lines PS1, the back gate lines VSB, and the data lines DTL.

The pixel array unit 80, which displays an image, is constituted by the display elements 70 arranged. In a two-dimensional matrix. In the pixel array unit 80, the number of rows of the display elements 70 is M, and the number of display elements 70 constituting each row is N. In the following descriptions, the display elements 70 may be referred to as pixels 70.

The numbers of the scanning lines WS, the power supply lines PS1, and the back gate lines VSB are M for each thereof. The pixels 70 in an mth row (where m=1, 2, and so on up to M) are connected to an mth scanning line $WS_m$, an mth power supply line $PS_m$, and an mth back gate line $VSB_m$, and constitute a single pixel row. The number of data lines DTL is N. The pixels 70 in an nth column (where n=1, 2, and so on up to N) are connected to an nth data line $DTL_n$.

Although not illustrated in FIG. 1, the display device 1 includes a shared power supply line connected in common to all of the pixels 70. As a shared voltage, a ground potential, for example, is constantly supplied to the shared power supply line.

The display device 1, includes a source driver 110, a vertical scanner 120, and a power source unit 130 for driving the pixel array unit 80.

The pixel array unit 80 is formed on a semiconductor substrate 100 obtained by forming a semiconductor layer constituted of silicon on a base material, for example. Note that the source driver 110, the vertical scanner 120, and the power source unit 130 are also formed on the semiconductor substrate 100. In other words, the display device 1 is a driver circuit-integrated display device. Note that in sonic cases, the circuits driving the pixel array unit 80 may be constituted as separate entities.

A signal $LD_{Sig}$, expressing a tone based on the image to be displayed, is input to the source driver 110 from a device which is not shown, for example. The signal $LD_{Sig}$ is, for example, a low-voltage digital signal. The source driver 110 generates an analog signal based on a tone value of the video signal $LD_{Sig}$, and the analog signal is used as a video signal for supply to the data lines DTL. The generated analog signal is a signal having a maximum value which is substantially equal to a power source voltage supplied to the source driver 110, and which has an amplitude of approximately several volts.

The vertical scanner 120 supplies a scanning signal to the scanning lines WS. Due to this scanning signal, the pixels 70 undergo line-sequential scanning on a row-by-row basis, for example. The power source unit 130 will be described as continuously supplying a predetermined power source voltage $V_{CC}$ (e.g., approximately 10 volts) to the power supply lines PS1, regardless of the scanning of the scanning lines WS. Note that in some cases, the configuration may be such that the voltage supplied to the power supply lines PS1 is switched in accordance with the scanning of the scanning lines WS.

A constant voltage is supplied to the back gate lines VSB. Although described in detail later with reference to FIG. 2, write transistors included in the pixels 70 are constituted by p-channel transistors. A configuration can be employed in which the same voltage as, or a different voltage from, the voltage supplied to the power supply lines PS1 is supplied to the back gate lines VSB. In the example illustrated in FIG. 1, the same voltage from the shared power source unit 130 is supplied to the power supply lines PS1 and the back gate lines VSB.

The display device 1 is, for example, a color display device, and a group of three pixels 70 arranged in the row direction constitutes a single color pixel. Accordingly, if N'=N/3, N' color pixels are arranged in the pixel array unit 80 in the row direction and M in the column direction, for a total of N'×M color pixels.

As described above, the pixels 70 undergo line-sequential scanning on a row-by-row basis by the scanning signal of the vertical scanner 120. The pixel 70 located in the mth row and the nth column will be called a (n,m)th pixel 70 hereinafter.

In the display device 1, the N pixels 70 arranged in the mth row are driven simultaneously. In other words, light emitting/non-light emitting timings of the N pixels 70 arranged in the row direction are controlled in units of the row to which those pixels 70 belong. If the display franerate of the display device 1 is represented by FR (times/second), a scanning period for a single row (known as the horizontal scanning period) when the display device 1 undergoes line-sequential scanning on a row-by-row basis is less than (1/FR)×(1/M).

An overview of the display device 1 has been given thus far. The pixels (display elements) 70 will be described in detail next.

Figure 2:
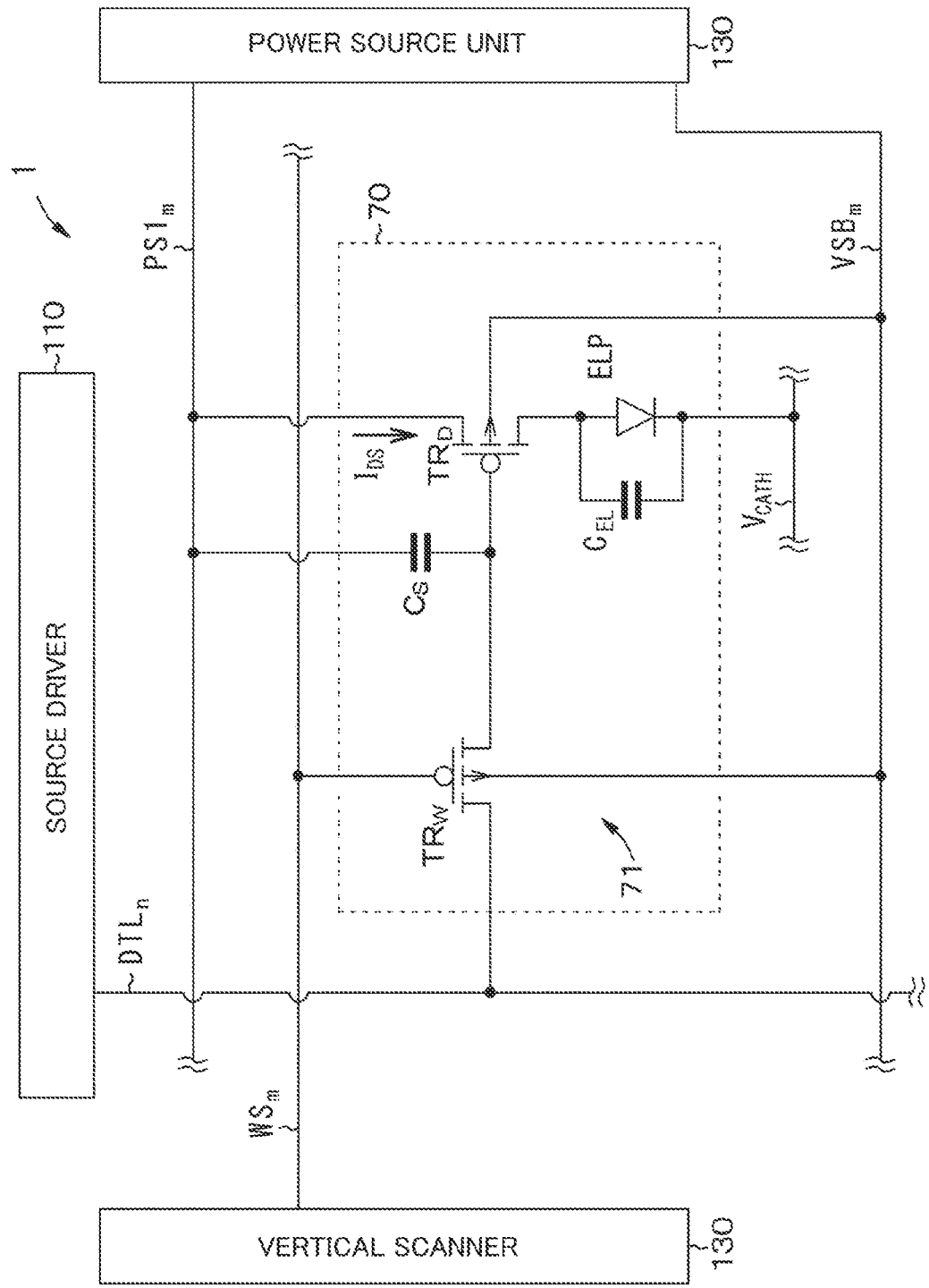
FIG. 2 is a schematic circuit diagram of a pixel (a display element) including a light-emitting unit and a drive circuit for driving the light-emitting unit.

FIG. 2 is a schematic circuit diagram of the pixel (the display element) including a light-emitting unit and a drive circuit for driving the light-emitting unit. Note that for illustrative purposes, FIG. 2 illustrates a wiring relationship for a single pixel 70, and more specifically, for the (n,m)th pixel 70.

As illustrated in FIG. 2, the pixel (display element) 70 includes a current-driven light-emitting unit ELP and a drive circuit 71 for driving the light-emitting unit ELP. The drive circuit 71 includes at least a write transistor $TR_W$ for writing a video signal and a drive transistor $TR_D$ for applying current to the light-emitting unit ELP. These are constituted by p-channel transistors.

The drive circuit 71 further includes a capacitance unit $C_S$. The capacitance unit $C_S$ is used to hold a voltage at a gate electrode of the drive transistor $TR_D$ with respect to a source region of the drive transistor $TR_D$ (what is known as the gate-source voltage). When the pixel 70 emits light, one source/drain region of the drive transistor $TR_D$ (the side connected to the power supply lines PS1, in FIG. 2) acts as the source region, and the other source/drain region acts as a drain region.

On electrode and another electrode that constitute the capacitance unit $C_S$ are connected to the one source/drain region and the gate electrode of the drive transistor $TR_D$, respectively. The other source/drain region of the drive transistor $TR_D$ is connected to an anode electrode of the light-emitting unit ELP.

The light-emitting unit ELP is a current-driven light-emitting unit having a light emission luminance that changes in accordance with a value of current flowing, and more specifically, is constituted by an organic electroluminescence light-emitting unit. The light-emitting unit ELP has a well-known configuration and structure including an anode electrode, a hole transport layer, a light-emitting layer, an electron transport layer, a cathode electrode, and the like.

Another end of the light-emitting unit ELP (specifically, the cathode electrode) is connected to the shared power supply line. A predetermined voltage $V_{CATH}$ (e.g., a ground potential) is supplied to the shared power supply line. Note that the capacitance of the light-emitting unit ELP is indicated by the reference sign $C_{EL}$. When the capacitance $C_{EL}$ of the light-emitting unit ELP is low and problems with respect to driving the pixel 70 will arise, an auxiliary capacitance connected in parallel with the light-emitting unit ELP may be provided as necessary.

The write transistor $TR_W$ includes a gate electrode connected to the scanning line WS, one source/drain region connected to the data line DTL, and another source/drain region connected to the gate electrode of the drive transistor $TR_D$. As a result, a signal voltage from the data line DTL is written to the capacitance unit $C_S$ via the write transistor $TR_W$.

As described above, the capacitance unit $C_S$ is connected between the one source/drain region and the gate electrode of the drive transistor $TR_D$. The power source voltage $V_{CC}$ is applied from the power source unit 130 to the one source/drain region of the drive transistor $TR_D$ via the power supply line $PS1_m$. When the video signal voltage $V_{Sig}$ from the data line DTL is written to the capacitance unit $C_S$ via the write transistor $TR_W$, the capacitance unit $C_S$ holds a voltage ($V_{CC}$-$V_{Sig}$) as the gate-source voltage of the drive transistor $TR_D$. A drain current $I_{ds}$, expressed by Equation (1) described in the background art, flows in the drive transistor $TR_D$, and the light-emitting unit ELP emits light at a luminance based on the current value.

In the display device 1, a voltage is supplied to a back gate of at least the write transistor $TR_W$, via the back gate line VSB provided separate from the power supply line PS1 that supplies a voltage to the drive transistor $TR_D$. In the example illustrated in FIG. 2, the voltage is supplied to the back gates of the write transistor $TR_W$ and the drive transistor $TR_D$ via the back gate line VSB. Accordingly, voltage is supplied to the back gate of each transistor through a system separate from the supply path through which the voltage is supplied to the drive transistor $TR_D$, or in other words, via a supply path independent from the supply path through which the voltage is supplied to the drive transistor $TR_D$.

Figure 3:
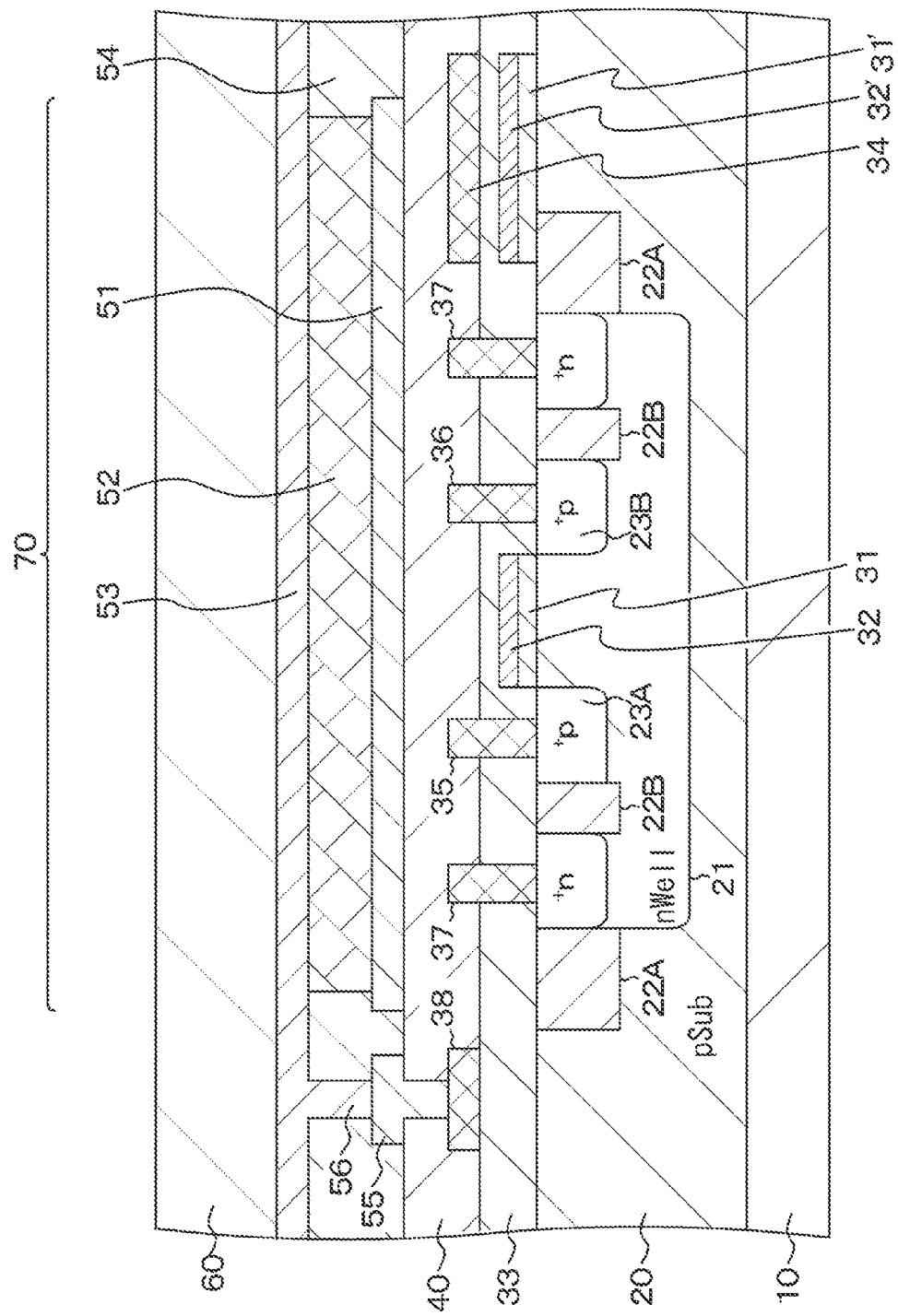
FIG. 3 is a schematic partial cross-sectional view of a part of a pixel array unit that includes a pixel.

Positional relationships between the light-emitting unit ELP, the transistors, and the like in three dimensions will be described here. FIG. 3 is a schematic partial cross-sectional view of a part of a pixel array unit that includes a pixel.

The drive circuit 71 in the pixel 70 is formed on a semiconductor substrate (reference sign 100, in FIG. 1) obtained by forming a semiconductor layer 20 constituted by silicon on a base material 10. The drive transistor $TR_D$ and the write transistor $TR_w$ are provided in an n-channel well 21 formed in the semiconductor layer 20. Note that for illustrative purposes, only the write transistor $TR_W$ is illustrated in FIG. 3. Reference signs 23A and 2313 indicate the one source/drain region of the write transistor $TR_W$.

Each transistor is surrounded by an element separation region 22A. Reference sign 32 indicates the gate electrode of the transistor $TR_W$, and reference sign 31 indicates a gate insulating layer. The element separation region 22A is formed by an STI (Shallow Trench isolation) structure in which an insulative material is embedded in a groove formed in a surface of the semiconductor substrate. The same applies to a separation region 22B, described later.

One electrode 32' constituting the capacitance unit $C_S$ is constituted by the same material layer as a gate electrode 32, and is formed on an insulating layer 31' constituted by the same material layer as a gate insulating layer 31. An inter-layer insulating layer 33 is formed on the entire surface of the semiconductor layer 20, including the gate electrode 32, the electrode 32', and the like. Another electrode 34 constituting the capacitance unit $C_S$ can be formed, for example, in the process of forming a contact plug 35, described later. The electrode 34 is disposed so as to oppose the electrode 32' with the inter-layer insulating layer 33 located therebetween.

In the write transistor $TR_W$, the one source/drain region 23A is connected to the data line DTL, which is not shown, via the contact plug 35, which is provided in the inter-layer insulating layer 33. Additionally, the other source/drain region 23B is connected to the gate electrode of the drive transistor $TR_D$ and the other electrode 34 constituting the capacitance unit $C_S$, via a contact plug 36 provided in the inter-layer insulating layer 33. Note that the above-described connection parts are hidden from view in FIG. 3.

The periphery of the write transistor $TR_W$ is surrounded by the element separation region 22B. A contact plug 37 provided in the inter-layer insulating layer 33 is connected to a part of the n-channel well 21 located further on the outside than the separation region 22B. The contact plug 37 is connected to the back gate line VSB, which is not shown. A back gate voltage is supplied to the write transistor $TR_W$ via the back gate line VSB as a result. A back gate voltage is supplied to the drive transistor $TR_D$ via the back gate line VSB as well, using the same structure as with the write transistor $TR_W$.

An inter-layer insulating layer 40 is furthermore formed on the inter-layer insulating layer 33. The light-emitting unit ELP, which is constituted by an anode electrode 51, a hole transport layer, a light-emitting layer, an electron transport layer, and a cathode electrode 53, is provided on the inter-layer insulating layer 40. Note that in the drawing, the hole transport layer, the light-emitting layer, and the electron transport layer are indicated as a single layer 52. A second inter-layer insulating layer 54 is provided on a part of the inter-layer insulating layer 40 where the light-emitting unit ELP is not provided, a transparent substrate 60 is disposed on the second inter-layer insulating layer 54 and the cathode electrode 53, and light emitted by the light-emitting layer passes through the substrate 60 and exits to the exterior.

The anode electrode 51 and the other source/drain region of the drive transistor $TR_D$ are connected via a contact hole and the like, which are not shown, provided in the inter-layer insulating layer 33. Note that the connection parts are hidden from view in FIG. 3.

Additionally, the cathode electrode 53 is connected to the shared power supply line, provided on an extended part of the inter-layer insulating layer 33 and indicated by reference sign 38, via contact plugs 56 and 55 provided. In the second inter-layer insulating layer 54 and the inter-layer insulating layer 40. The shared power supply line 38 supplies the predetermined voltage $V_{CATH}$ to each of the pixels 70 as a shared voltage.

Positional relationships between the light-emitting unit ELP, the transistors, and the like in three dimensions have been described thus far. An issue with a display device according to a reference example will be described next to facilitate understanding of the present disclosure.

Figure 4:
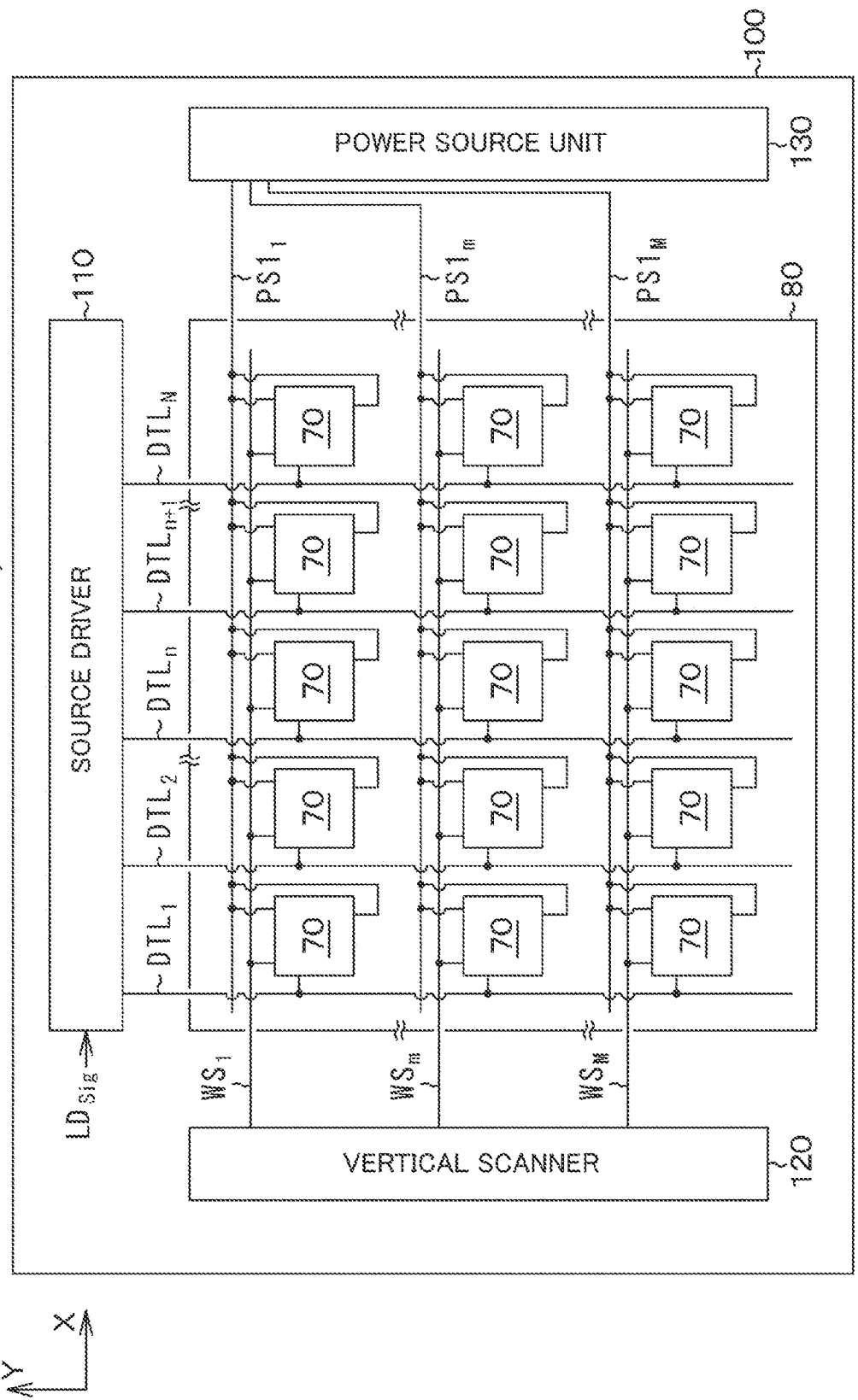
FIG. 4 is a conceptual diagram of a display device according to a reference example.
Figure 5:
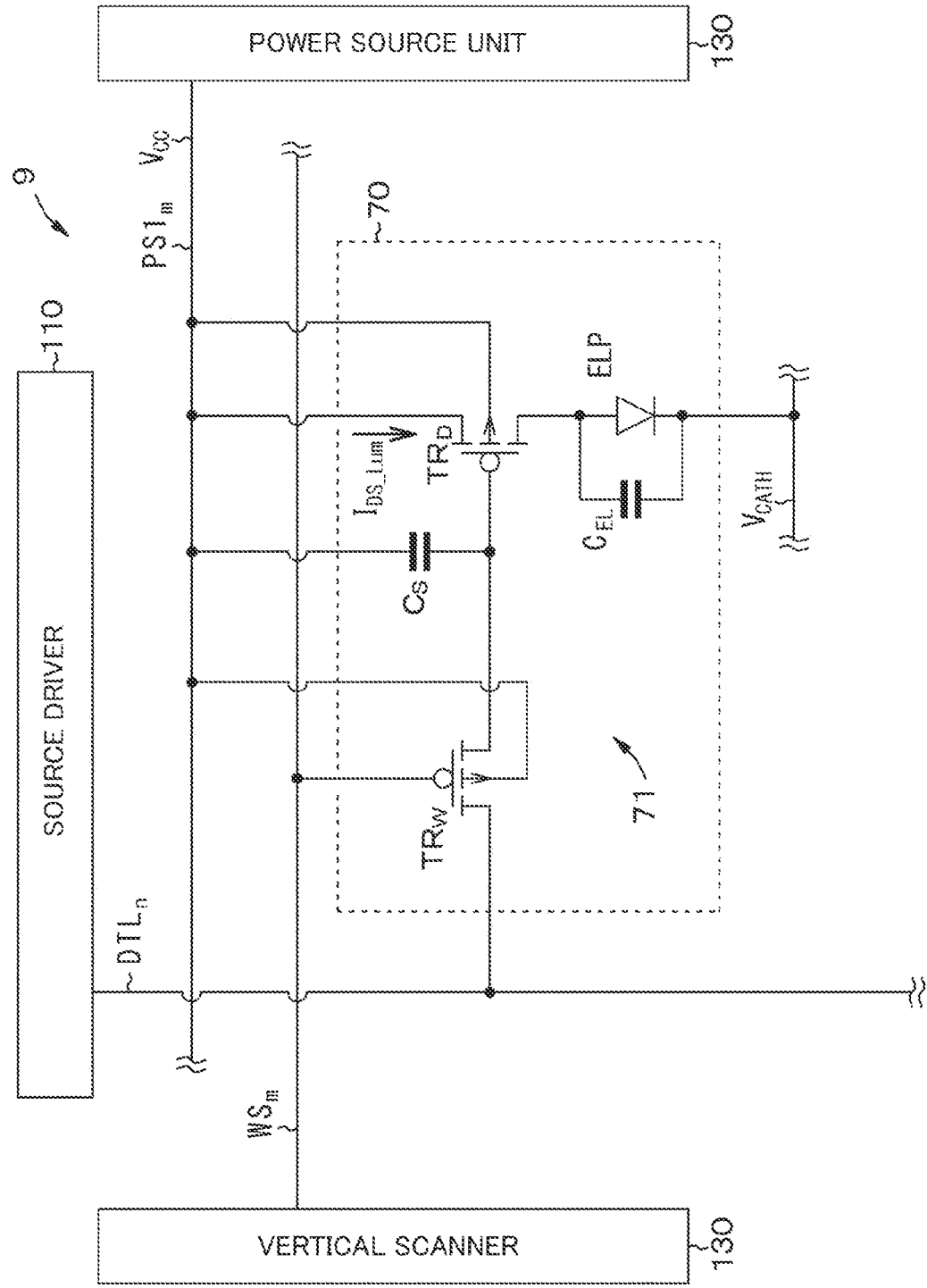
FIG. 5 is a schematic circuit diagram for illustrating an operation state of a pixel in the display device according to the reference example.

FIG. 4 is a conceptual diagram of the display device according to the reference example. FIG. 5 is a schematic circuit diagram for illustrating an operation state of a pixel in the display device according to the reference example.

A display device 9 according to the reference example illustrated in FIG. 4 has a configuration in which the back gate lines TSB have been omitted from the display device 1, and the back gate voltage is applied to each of the pixels 70 via the power supply lines PS1.

When a p-channel drive transistor $TR_D$ is used, it is necessary to put the gate-source voltage of the drive transistor $TR_D$ (called $V_{gs}$) to a negative potential in order to cause the light-emitting unit ELP to emit light. To facilitate understanding, the following descriptions will assume that a video signal voltage for a white display is set to [$V_{CC}$ minus 1 volt], and that a video signal voltage for a black display is set to [$V_{CC}$].

When a given pixel 70 is to display white, [$V_{CC}$ minus 1 volt] is supplied to the data line DTL from the source driver 110, and in that state, the write transistor TR$_W$ is put into a non-conductive state after being put into a conductive state. Then, by using the capacitance unit C$_S$ to keep V$_g$, at [minus 1 volt], a drain current I$_{DS\_Lum}$ corresponding to a white display can be applied to the light-emitting unit ELP for one frame.

A change in the voltage of the power supply line PS1 caused by drain current flowing in the drive, transistor TR$_D$ will be described here.

Figure 6:
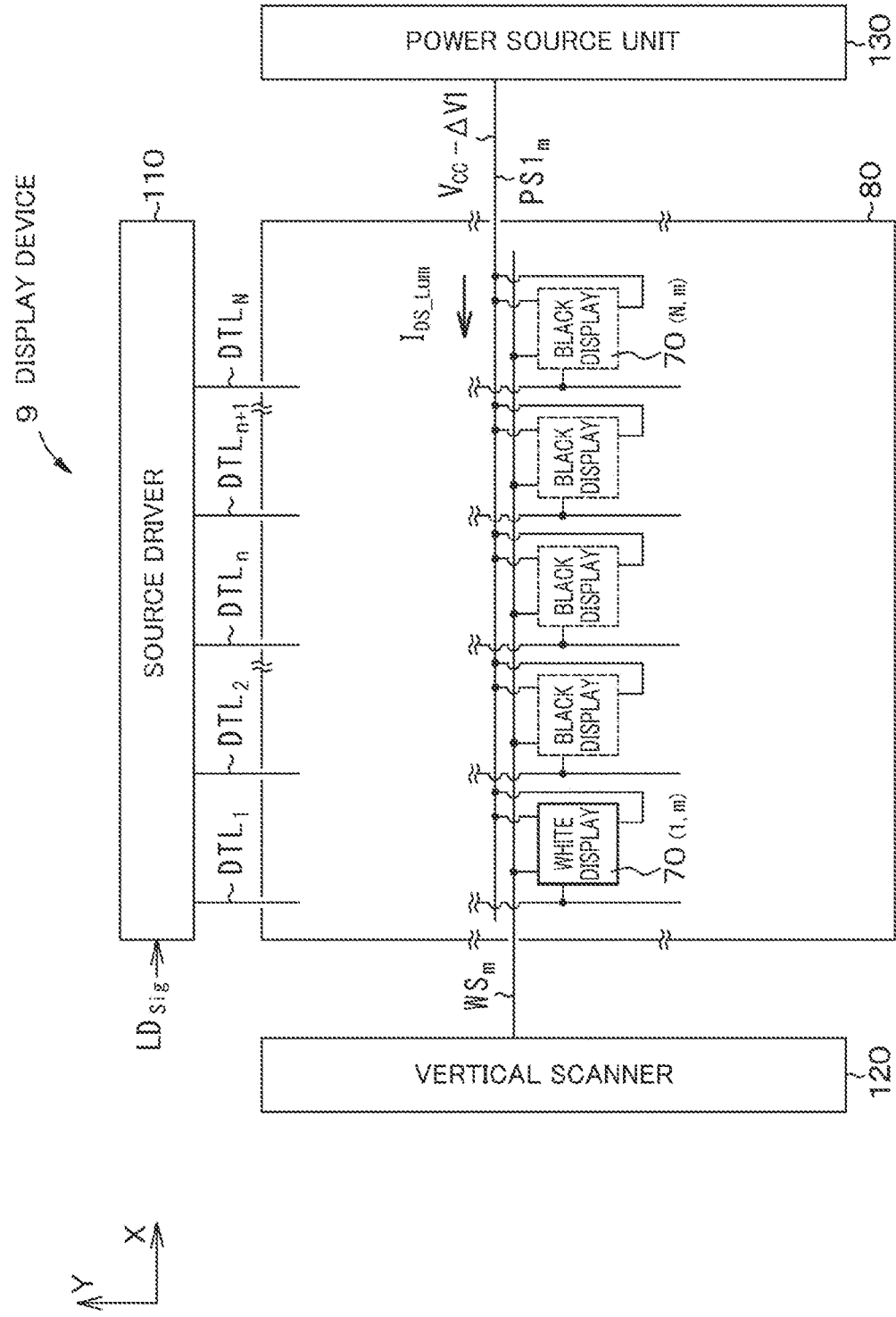
FIG. 6 is a schematic diagram for illustrating a voltage fluctuation arising in a power supply line PS1 when one pixel displays white and another pixel displays black, in a pixel group belonging to an mth row in the display device according to the reference example.

FIG. 6 is a schematic diagram for illustrating a voltage fluctuation arising in the power supply line PS1 when one pixel displays white and another pixel displays black, in a pixel group belonging to the mth row in the display device according to the reference example.

In this case, the drain current I$_{DS\_Lum}$ for one pixel 70 flows in the power supply line PS1$_m$. The power supply line PS1$_m$ has a certain level of wire resistance, and a voltage drop therefore arises when current flows in the power supply line PS1$_m$. The voltage drop is represented by reference sign ΔV1.

Figure 7:
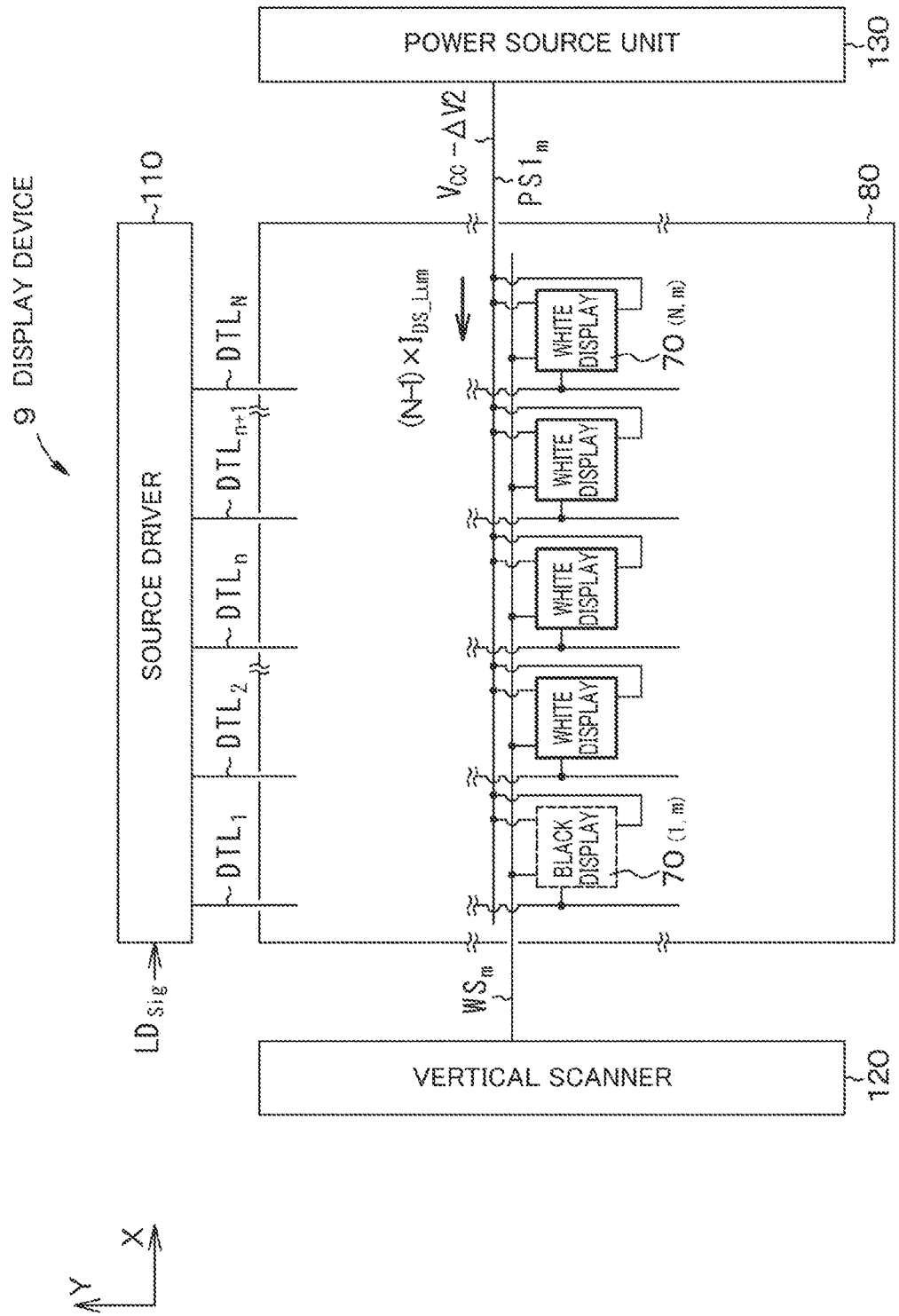
FIG. 7 is a schematic diagram for illustrating a voltage fluctuation arising in a power supply line PS1 when one pixel displays black and another pixel displays white, in a pixel group belonging to an mth row in the display device according to the reference example.

FIG. 7 is a schematic diagram for illustrating a voltage fluctuation arising in the power supply line PS1 when one pixel displays black and another pixel displays white, in a pixel group belonging to the mth row in the display device according to the reference example.

In this case, the drain current of (N−1) pixels 70, i.e., current indicated by (N−1)×I$_{DS\_Lum}$, flows in the power supply line PS1$_m$. Thus compared to FIG. 6, there is a greater voltage drop in the power supply line PS1$_m$. When the voltage drop in the power supply line PS1$_m$ at this time is represented by reference sign ΔV2, the relationship ΔV2>ΔV1 holds true.

In the display device 9 according to the reference example, the back gate voltage in each pixel 70 is supplied via the power supply line PS1. Accordingly, when the voltage drop arises in the power supply line PS1$_m$, the back gate voltage of the transistor constituting the drive circuit of the pixel 70 changes as well. This affects the extent of charge leakage from the capacitance unit C$_S$.

Figure 8:
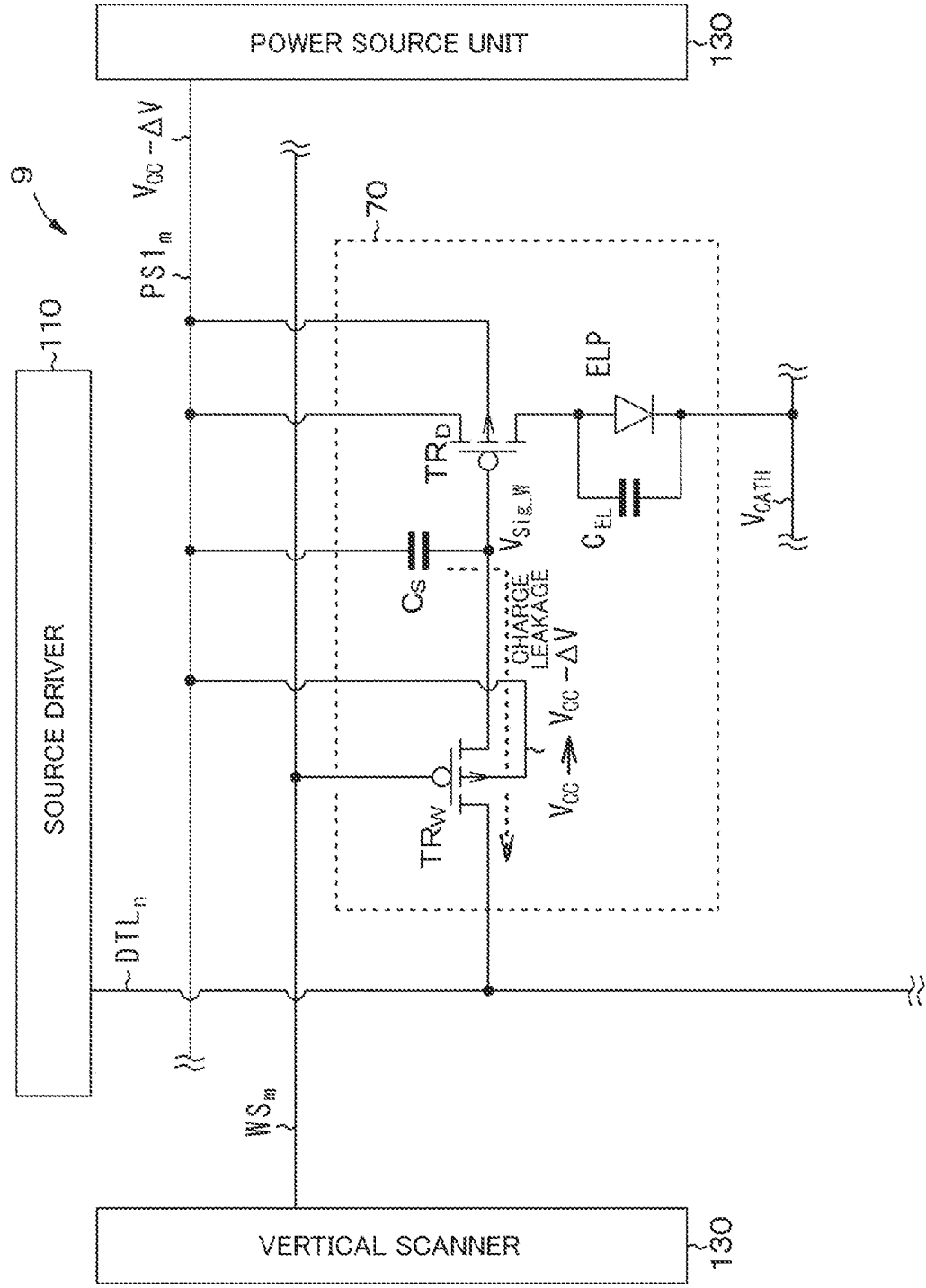
FIG. 8 is a schematic circuit diagram for illustrating charge leakage from a capacitance unit $C_S$, caused by voltage fluctuation arising in the power supply line PS1.

FIG. 8 is a schematic circuit diagram for illustrating charge leakage from the capacitance unit C$_S$, caused by voltage fluctuation arising in the power supply line PS1.

When a voltage drop ΔV occurs in the power supply line PS1$_m$ while the capacitance unit C$_S$ of the pixel 70 is holding a voltage V$_{Sig\_W}$ corresponding to a white display, the back gate voltage of the write transistor TR$_W$ changes from V$_{CC}$ to V$_{CC}$-ΔV. This makes it easier for leaks to arise between the source/drain of the write transistor TR$_W$, which makes it easier for the charge to leak from the capacitance unit C$_S$. As a result, the luminance of the pixel 70 displaying white decreases, and the display changes to gray.

Then, as described with reference to FIG. 6 and FIG. 7, the voltage fluctuation arising in the power supply line PS1 also changes in accordance with the number of pixels 70 displaying white in the pixel group belonging to the nth row. The extent to which the luminance drops in pixels displaying white is therefore not uniform. As such, an issue remains in the display device according to the reference example, in terms of ensuring the uniformity of displayed images.

An issue in the display device according to the reference example has been described above.

In the display device 1 according to the present disclosure, the voltage drop in the power supply line PS1 does not affect the back gates of the write transistors. This provides an excellent characteristic in that the uniformity of displayed images is ensured.

Figure 9:
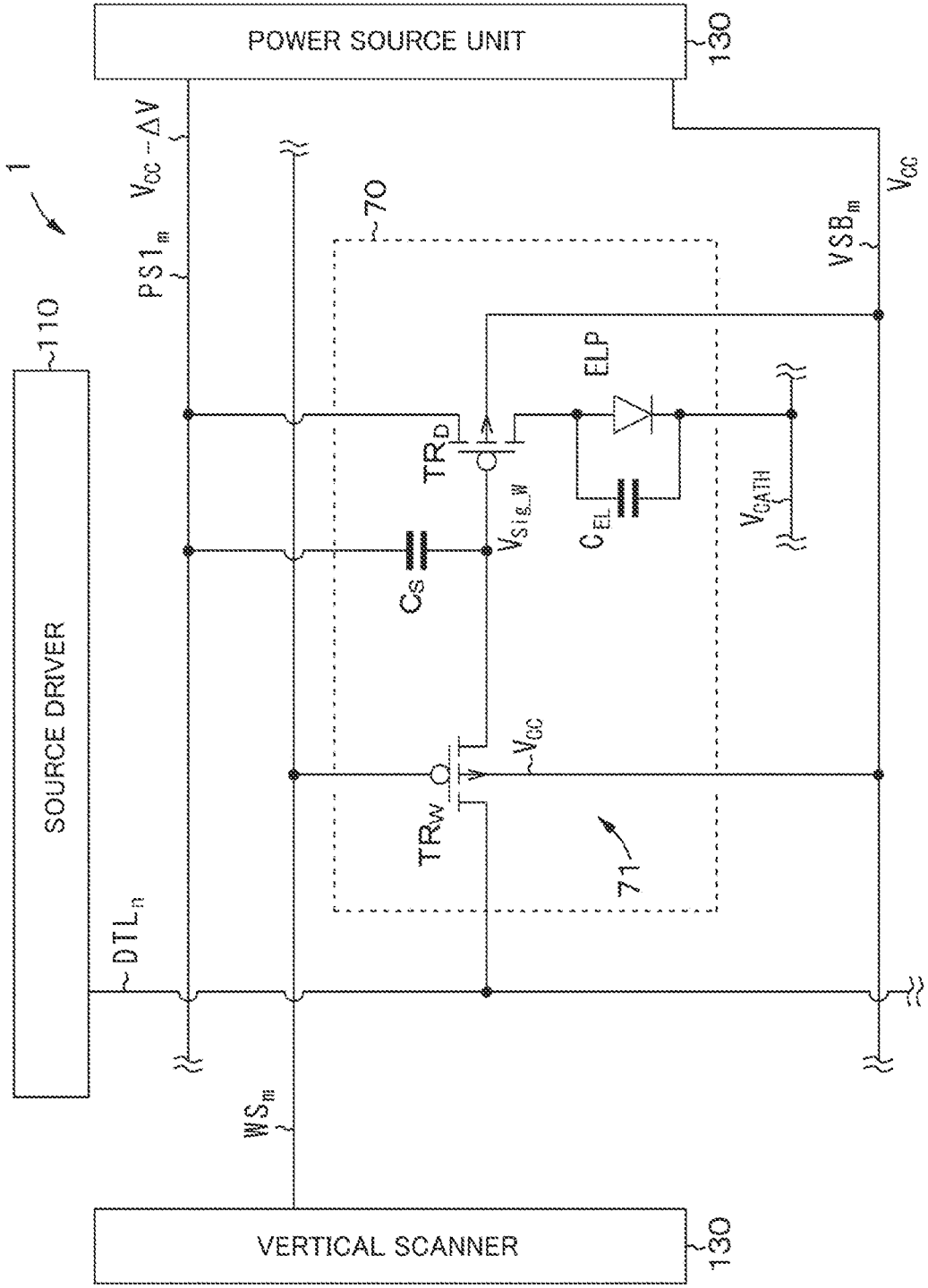
FIG. 9 is a schematic circuit diagram for illustrating a supply path of back gate voltage in the display device according to the first embodiment.

FIG. 9 is a schematic circuit diagram for illustrating a supply path of back gate voltage in the display device according to the first embodiment.

As illustrated in FIG. 9, in the display device 1, even if a voltage drop occurs in the power supply line PS1$_m$, the drive voltage V$_{CC}$ is constantly supplied via the back gate line VSB$_m$ as the back gate voltage of the write transistor TR$_W$. Accordingly, the extent of charge leakage from the capacitance unit C$_S$ is not affected by the light emission states of the pixel group belonging to the nth row and the like.

Figure 10:
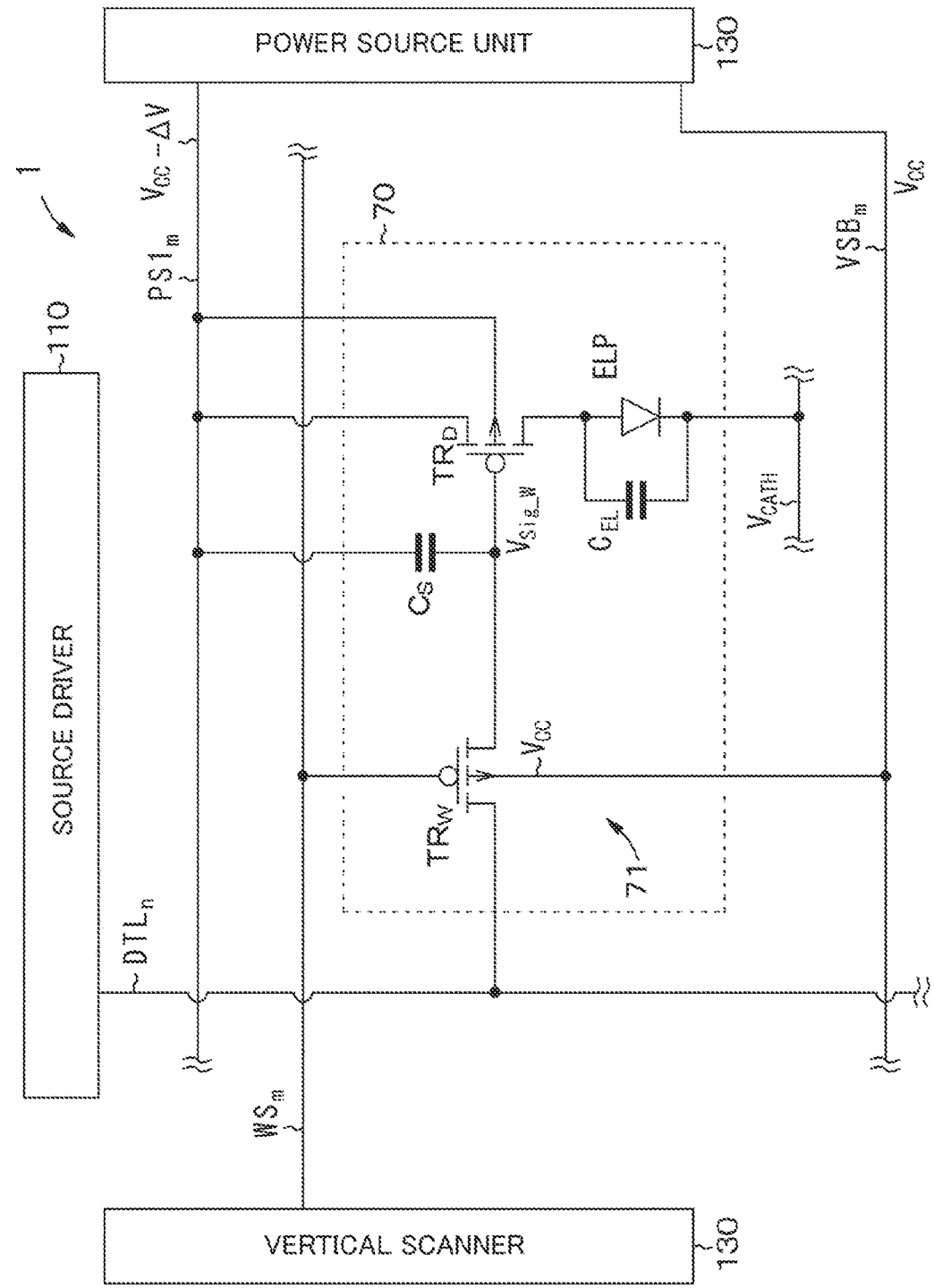

Note that changes in the back gate voltage of the drive transistor TR$_D$ do not contribute to charge leakage from the capacitance unit C$_S$. Thus as illustrated in FIG. 10, for example, the configuration may be such that the back gate voltage of the write transistor TR$_W$ is supplied from the back gate line VSB, and the back gate voltage of the drive transistor is supplied from the power supply line PS1.

Additionally, in the example illustrated in FIG. 1, the same voltage from the shared power source unit 130 is described as being supplied to the power supply lines PS1 and the back gate lines VSB. No particular problems arise even in this example, when the power source unit 130 has sufficient voltage supply capabilities.

However, it is also conceivable that the voltage supply capabilities of the power source unit 130 will be affected by the drain current flowing in the power supply line PS1, and the voltage itself of the power source unit 130 will fluctuate. Additionally, from the perspective of further suppressing charge leakage via the write transistor TR$_W$, it is conceivable to supply a voltage, different from the voltage supplied to the power supply line PS1, to the back gate line VSB. Variations on the first embodiment will be described hereinafter.

Figure 11:
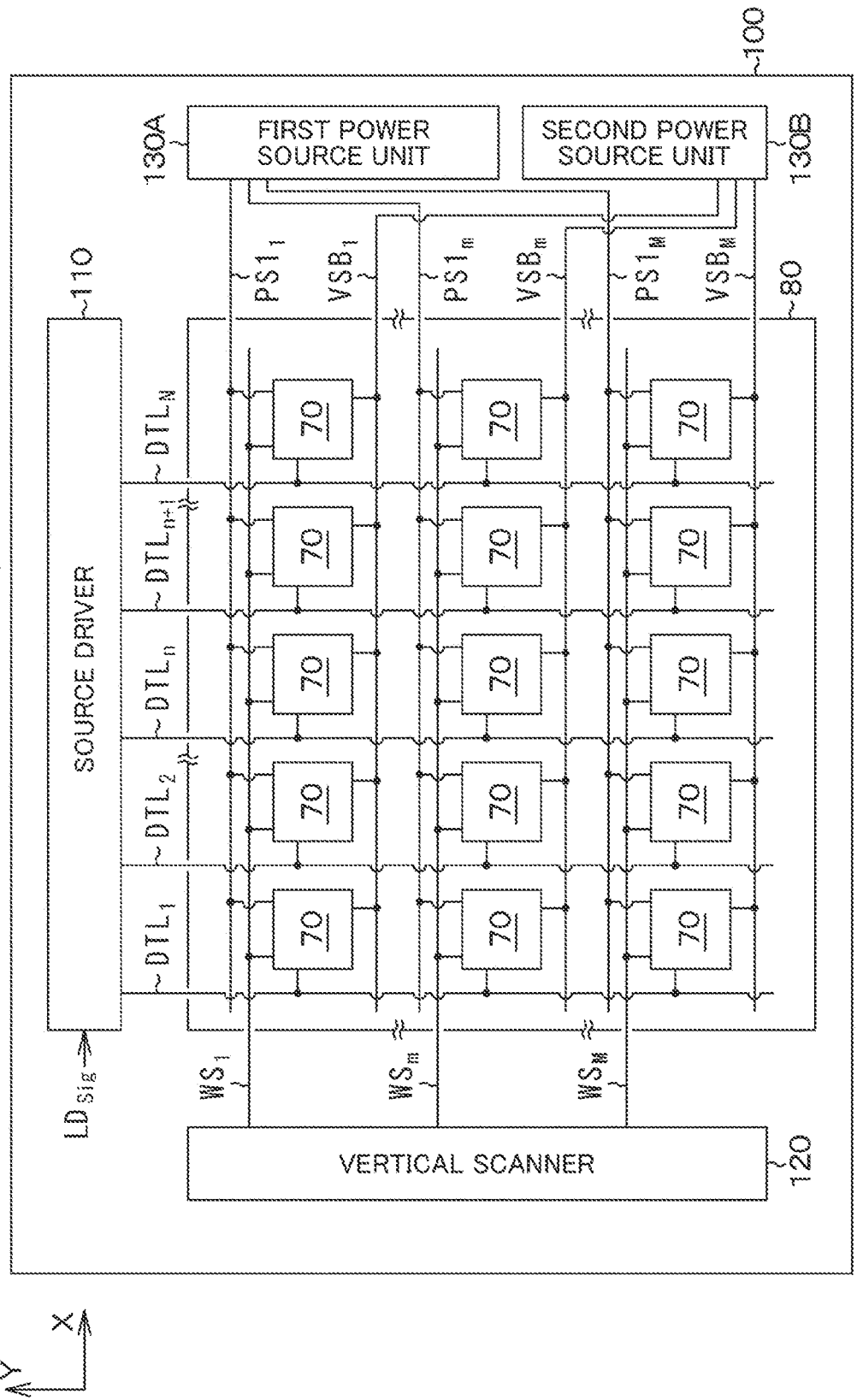
FIG. 11 is a conceptual diagram of a display device according to a first modification example on the first embodiment.

FIG. 11 is a conceptual diagram of a display device according to a first modification example on the first embodiment.

In a display device 1A according to the first modification example, a voltage is supplied to the power supply lines PS1 from a power source unit (a first power source unit) 130A corresponding to the power supply lines PS1, and a voltage is supplied to the back gate lines VSB from a power source unit (a second power source unit) 130B different from the power source unit 130A corresponding to the power supply lines PS1.

In the display device 1A, a voltage is supplied to the back gate lines VSB by a power source unit independent from the power source unit for the power supply lines PS1. Accordingly, a stable voltage can be supplied to the back gate lines VSB even if the voltage itself generated by the power source unit 130 fluctuates qualitatively.

This configuration also provides an advantage in that supplying a different voltage to the back gate lines VSB from the voltage supplied to the power supply lines PS1 can be handled.

Figure 12:
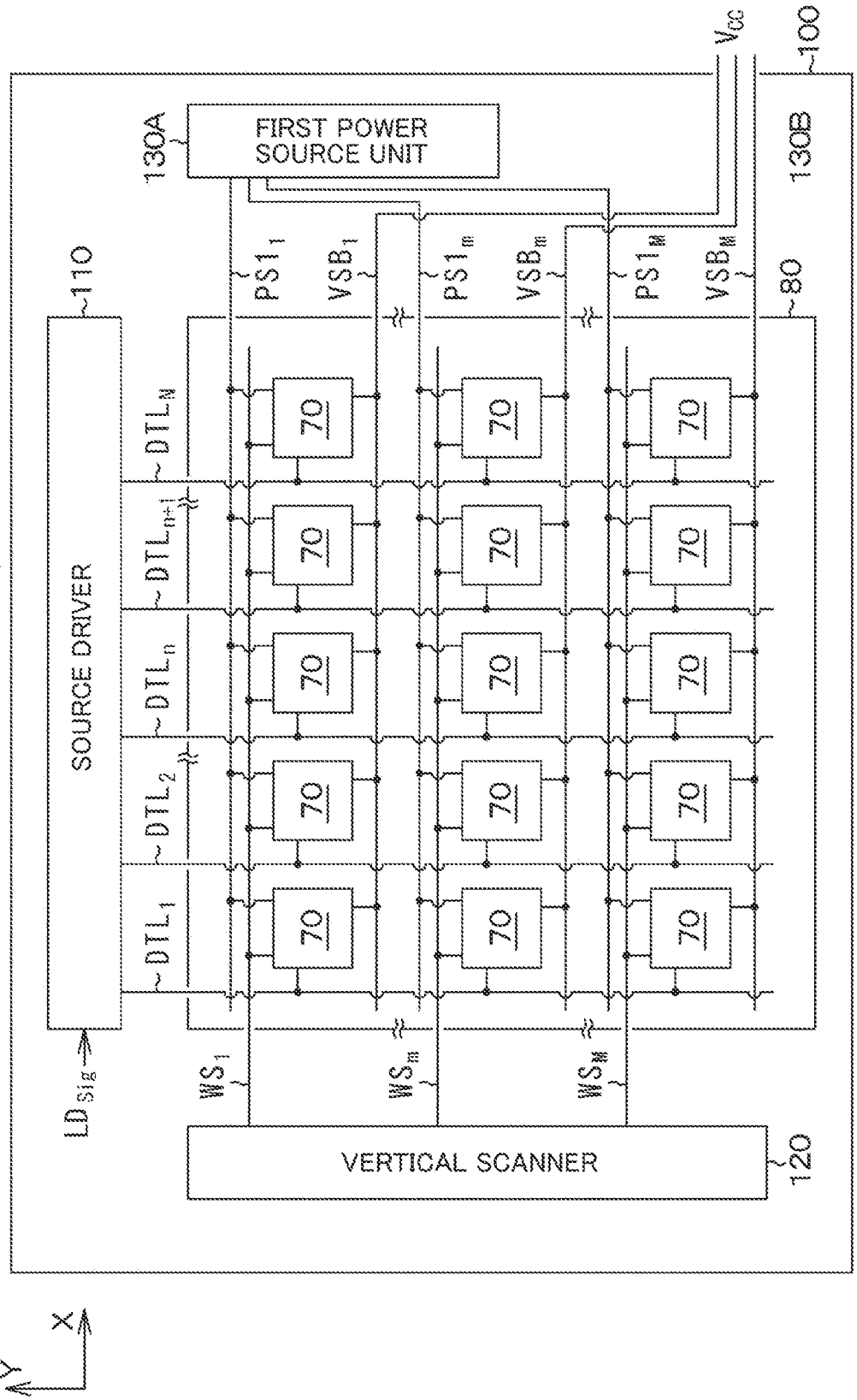
FIG. 12 is a conceptual diagram of a display device according to a second modification example on the first embodiment.

FIG. 12 is a conceptual diagram of a display device according to a second modification example on the first embodiment.

A display device 1B according to the second modification example corresponds the configuration of the display device 1A according to the first modification example, but in which the voltage for the back gate lines VSB is supplied from the exterior of the display device. This configuration provides an advantage in that it is easy to make the voltage supplied to the back gate lines VSB even more stable.

Second Embodiment

A second embodiment also pertains to a display device and an electronic device according to the present disclosure.

The first embodiment describes a constant voltage being supplied to the back gate lines VSB. However, for the purpose of reducing leakage of the charge held in the capacitance unit, it is not absolutely necessary to supply a constant voltage to the back gate lines VSB. In other words, a configuration can also be employed in which a stable back gate voltage is supplied to the back gate lines VSB when the write transistors are in a non-conductive state.

Figure 13:
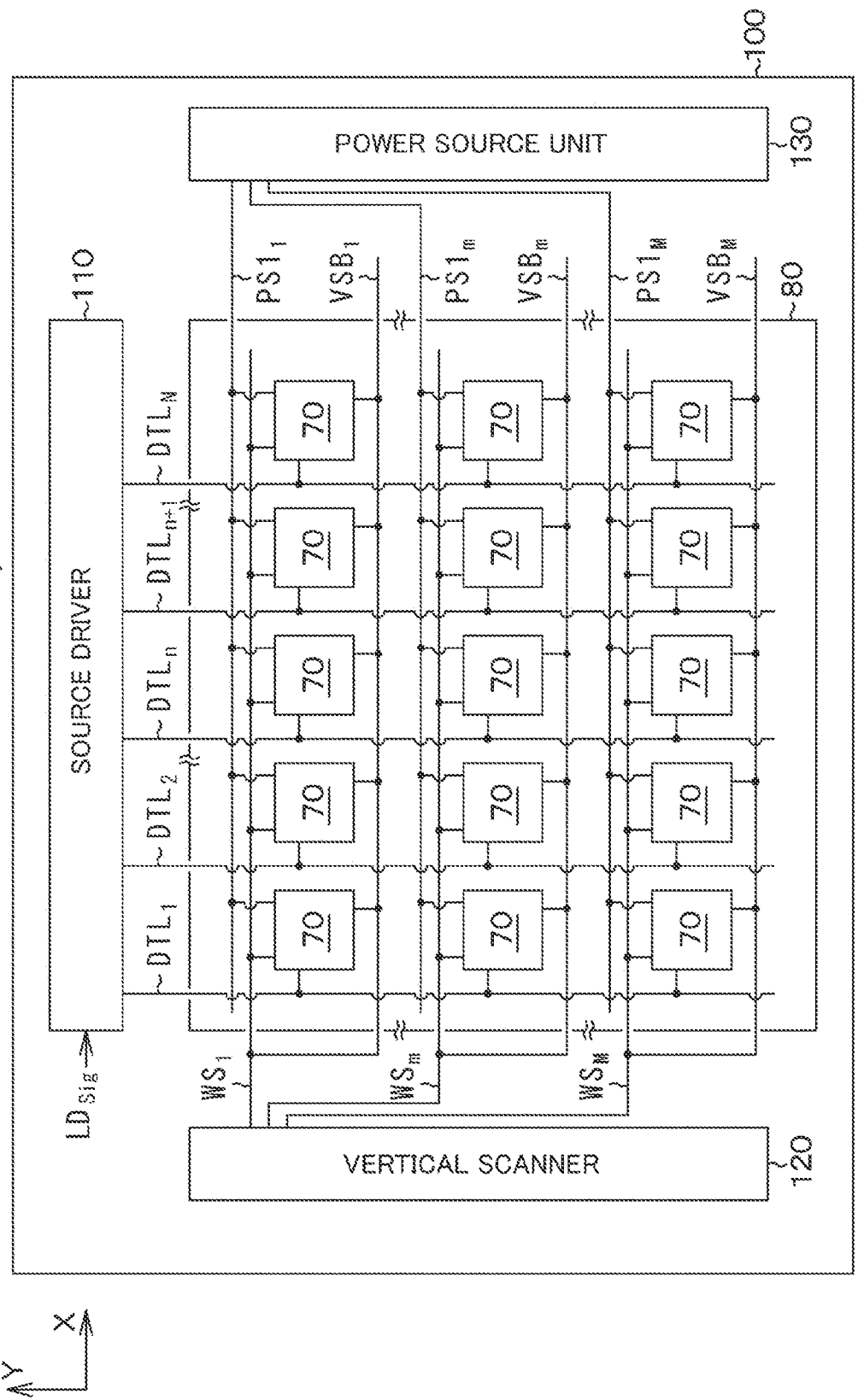
FIG. 13 is a conceptual diagram of a display device according to a second embodiment.

FIG. 13 is a conceptual diagram of the display device according to the second embodiment.

In a display device 2 according to the second embodiment, a voltage that changes in accordance with the scanning of the display elements is supplied to the back gate lines VSB.

A voltage that is the same as the voltage supplied to the scanning line connected to the gate electrode of the write transistor $TR_W$ is supplied to the back gate line VSB. To be more specific, the mth back gate line $VSB_m$ and the mth scanning line $WS_m$ are connected, and a voltage that changes in accordance with the scanning of the scanning line $WS_m$ is supplied from the vertical scanner 120.

In the display device 2 as well, a voltage is supplied to a back gate of at least the write transistor $TR_W$, via the back gate line VSB provided separate from the power supply line that supplies a voltage to the drive transistor. As such, in the display device 2 as well, the voltage drop in the power supply line $PS1_m$ does not affect the back gate of the write transistor $TR_W$. This provides an excellent characteristic in that the uniformity of displayed images is ensured.

[Variations on Drive Circuit]

In the pixels 70 of the display devices illustrated in FIG. 1, FIG. 13, and the like, the drive circuit is described as being constituted by a p-channel write transistor, a drive transistor, and a capacitance unit. The drive circuit can actually take on a variety of configurations. Several variations on the drive circuit, as well as examples of the supply of the back gate voltage according to the variations, will be described hereinafter with reference to the drawings.

Figure 14:
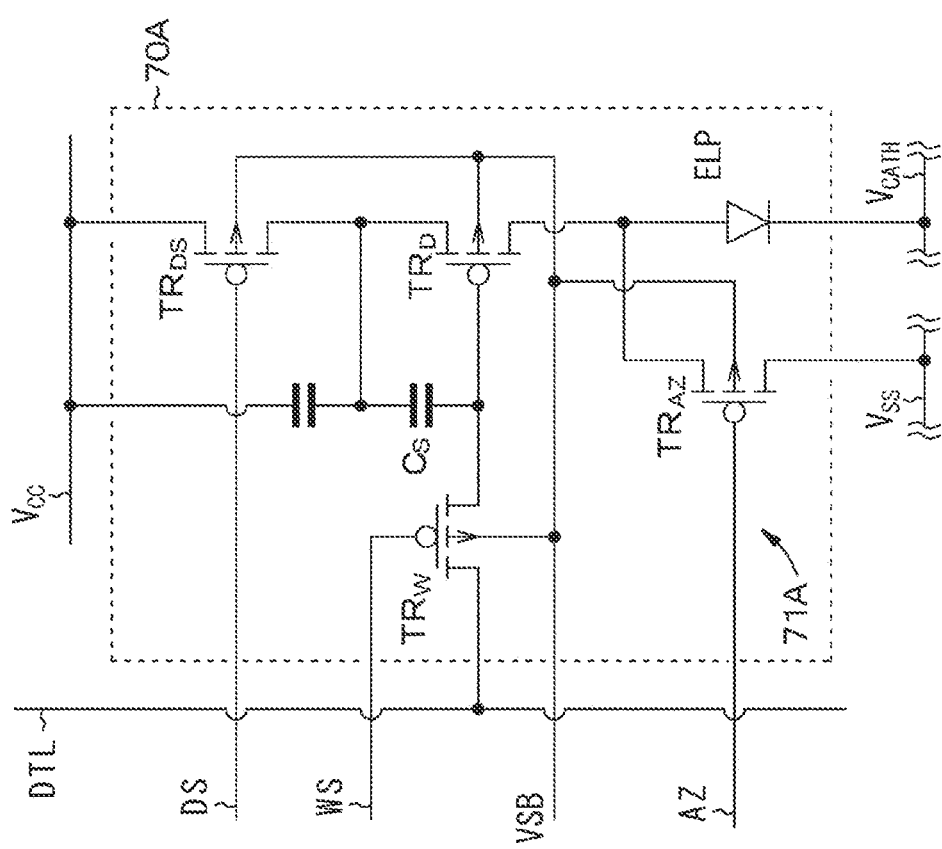
FIG. 14 is a schematic circuit diagram for illustrating a supply path of back gate voltage in a drive circuit included in a pixel according to a first modification example.

FIG. 14 is a schematic circuit diagram for illustrating a supply path of back gate voltage in a drive circuit included in a pixel according to a first modification example.

A pixel 70A illustrated, in FIG. 14 includes a drive circuit 71A constituted by four p-channel transistors and two capacitors. With this drive circuit 71A, the effects of variations in a threshold voltage of the drive transistor $TR_D$ can be canceled. Images can therefore be displayed with excellent luminance uniformity.

In the drive circuit 71A, a voltage is supplied to all four p-channel transistors from the back gate line VSB. The supplied voltage may be the same voltage as the drive voltage $V_{CC}$, or may be a higher voltage.

Although the back gate voltages are all common for the four p-channel transistors in the example illustrated in FIG. 14, the configuration is not limited thereto. For example, as described in the second embodiment, the configuration may be such that a voltage which changes in accordance with the scanning of the scanning line $WS_m$ is supplied to the write transistor $TR_W$. The same applies to the examples illustrated in FIG. 15 to FIG. 17 described below.

Figure 15:
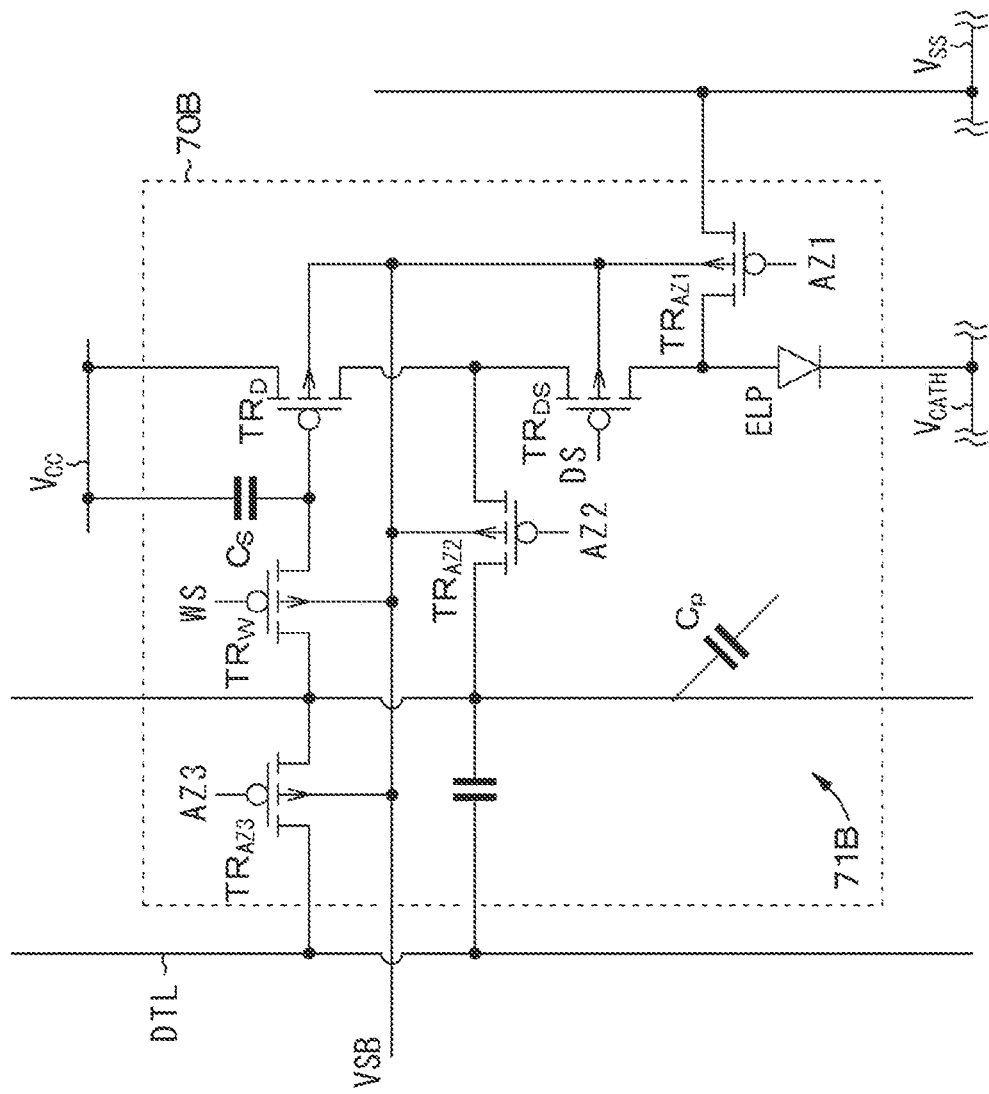
FIG. 15 is a schematic circuit diagram for illustrating a supply path of back gate voltage in a drive circuit included in a pixel according to a second modification example.

FIG. 15 is a schematic circuit diagram for illustrating a supply path of back gate voltage in a drive circuit included in a pixel according to a second modification. example.

A pixel 70B illustrated in FIG. 15 includes a drive circuit 71B constituted by six p-channel transistors and three capacitors. In the example illustrated in the drawing, a voltage is supplied to all six p-channel transistors from the back gate line VSB.

Figure 16:
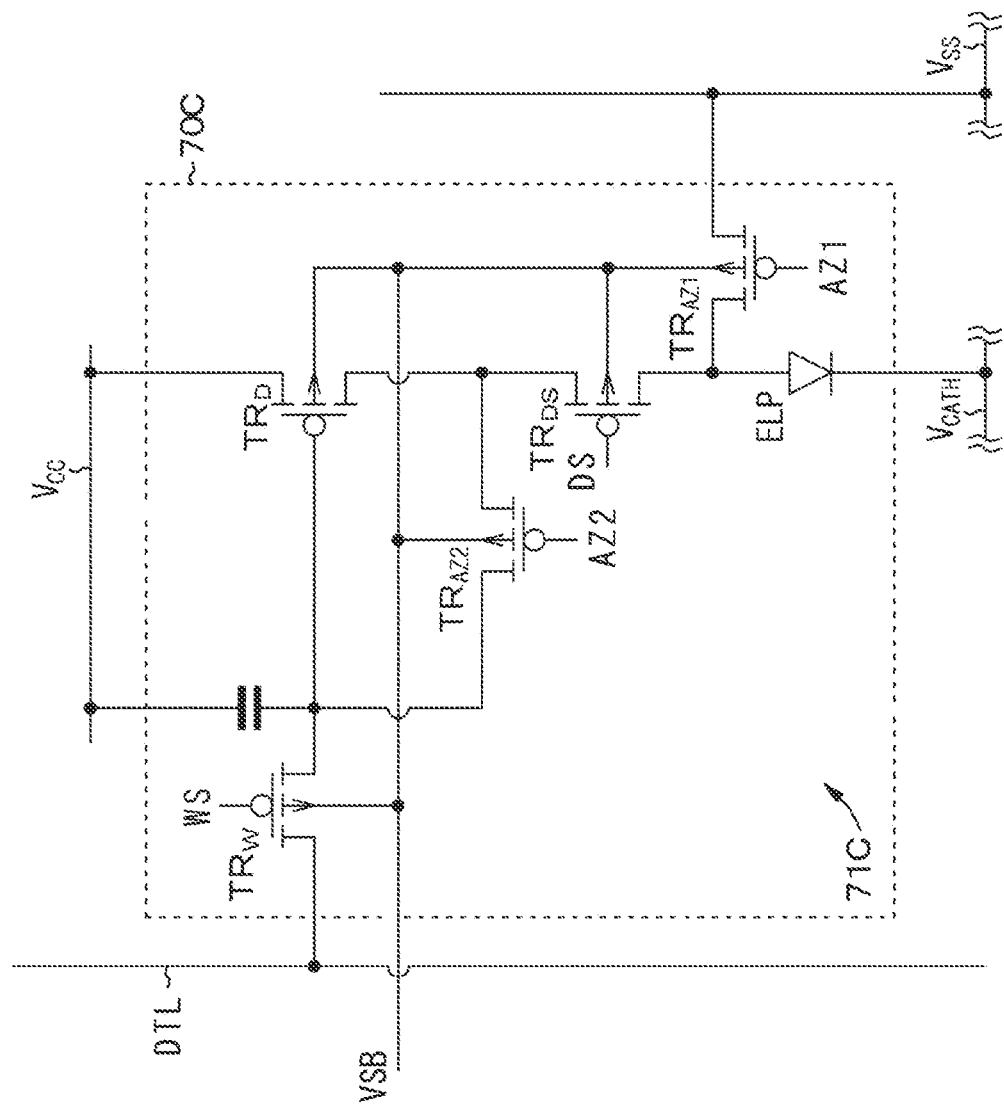
FIG. 16 is a schematic circuit diagram for illustrating a supply path of back gate voltage in a drive circuit included in a pixel according to a third modification example.

FIG. 16 is a schematic circuit diagram for illustrating a supply path of back gate voltage in a drive circuit included in a pixel according to a third modification example.

A pixel 70C illustrated in FIG. 16 includes a drive circuit 71C constituted by five p-channel transistors and one capacitor. In the example illustrated in the drawing, a voltage is supplied to all five p-channel transistors from the back gate line VSB.

Figure 17:
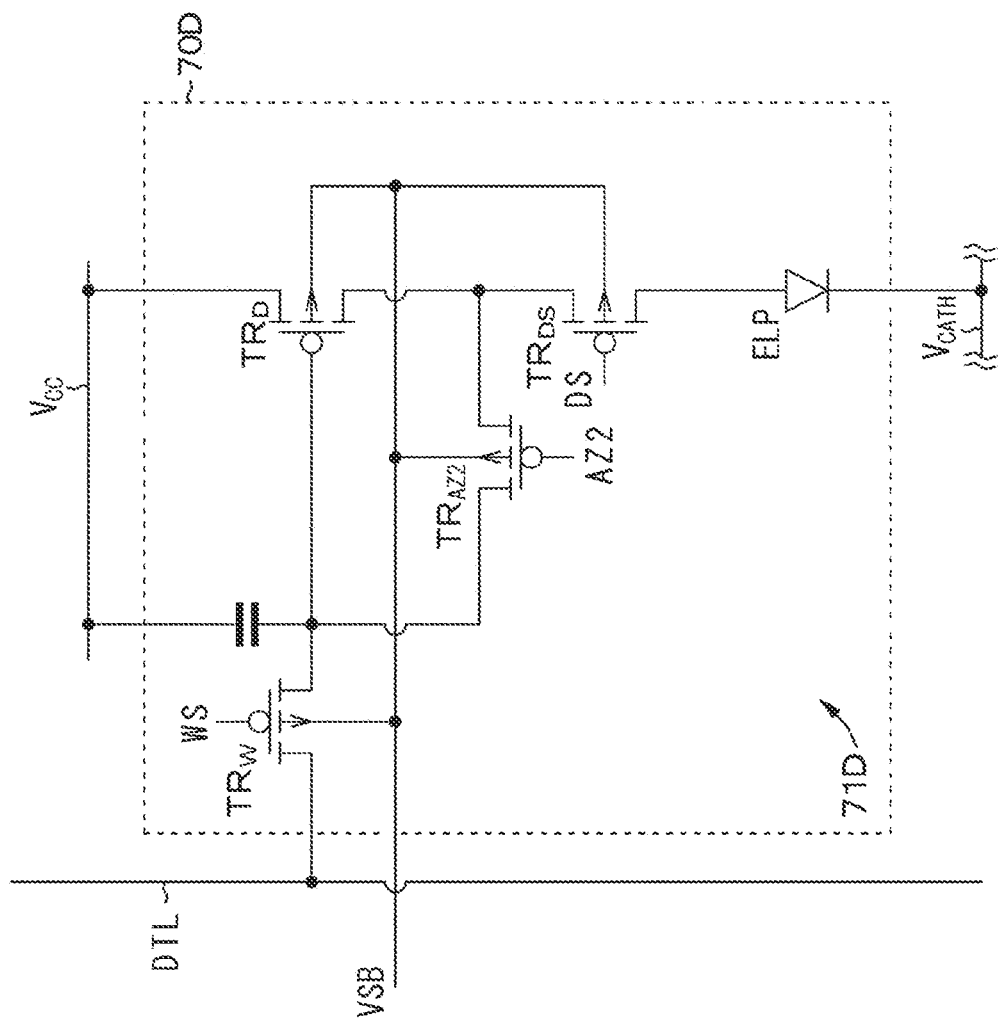
FIG. 17 is a schematic circuit diagram for illustrating a supply path of back gate voltage in a drive circuit included in a pixel according to a fourth modification example.

FIG. 17 is a schematic circuit diagram for illustrating a supply path of back gate voltage in a drive circuit included in a pixel according to a fourth modification example.

A pixel 70D illustrated in FIG. 17 includes a drive circuit 71D constituted by four p-channel transistors and one capacitor. In the example illustrated in the drawing, a voltage is supplied to all four p-channel transistors from the back gate line VSB.

In all of the drive circuits described above, the transistors constituting the drive circuits are constituted by p-channel transistors. However, the drive circuit can also be constituted by n-channel transistors, or can be configured including two types of transistors having different conductivity types. Examples thereof will be described hereinafter.

Figure 18:
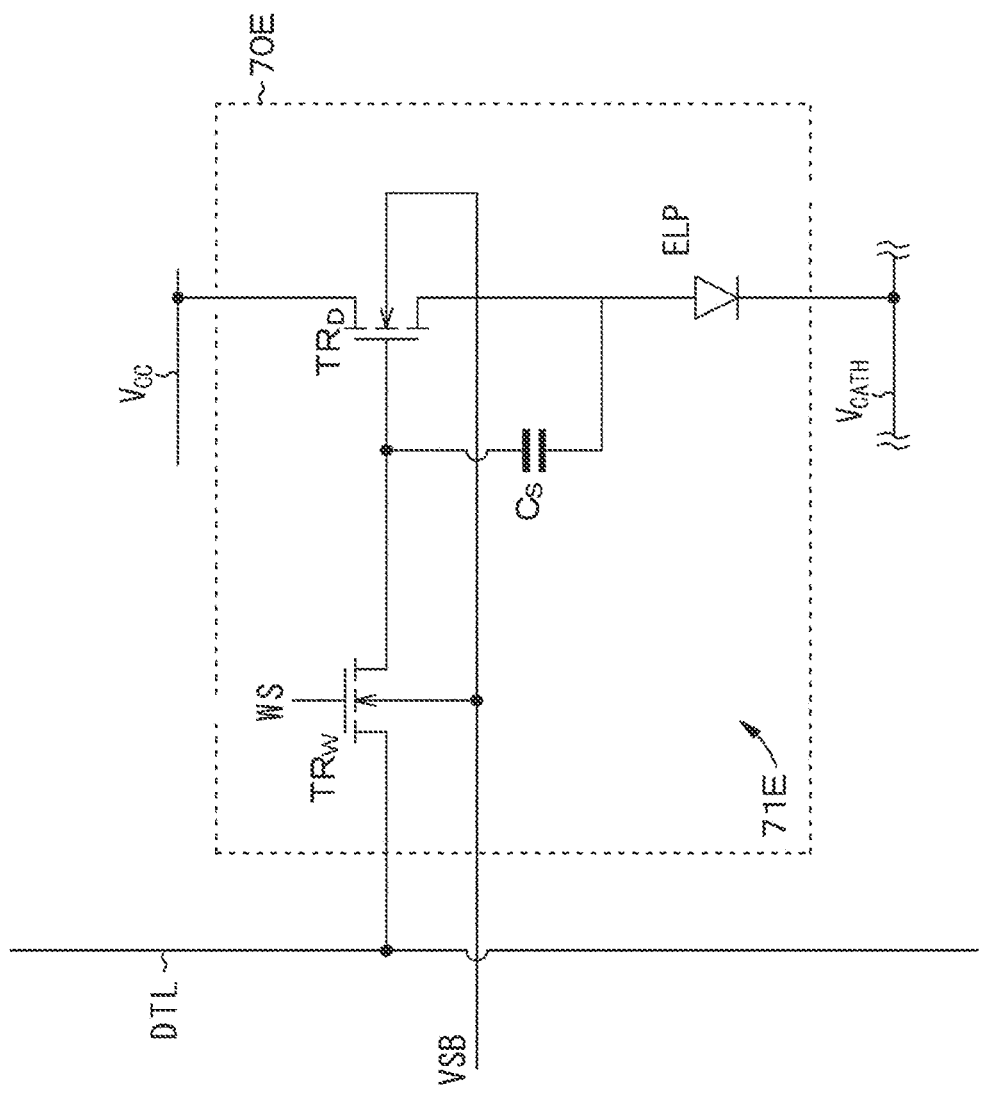
FIG. 18 is a schematic circuit diagram for illustrating a supply path of back gate voltage in a drive circuit included in a pixel according to a fifth modification example.

FIG. 18 is a schematic circuit diagram for illustrating a supply path of back gate voltage in a drive circuit included in a pixel according to a fifth modification example.

A pixel 70E illustrated in FIG. 18 includes a drive circuit 71E constituted by two n-channel transistors and one capacitor. In the example illustrated in the drawing, a voltage is supplied to both of the two n-channel transistors from the back gate line VSB. The supplied voltage may be at the lowest potential used in the driving of the display element (e.g., a ground voltage), or may be a voltage at an even lower potential.

Figure 19:
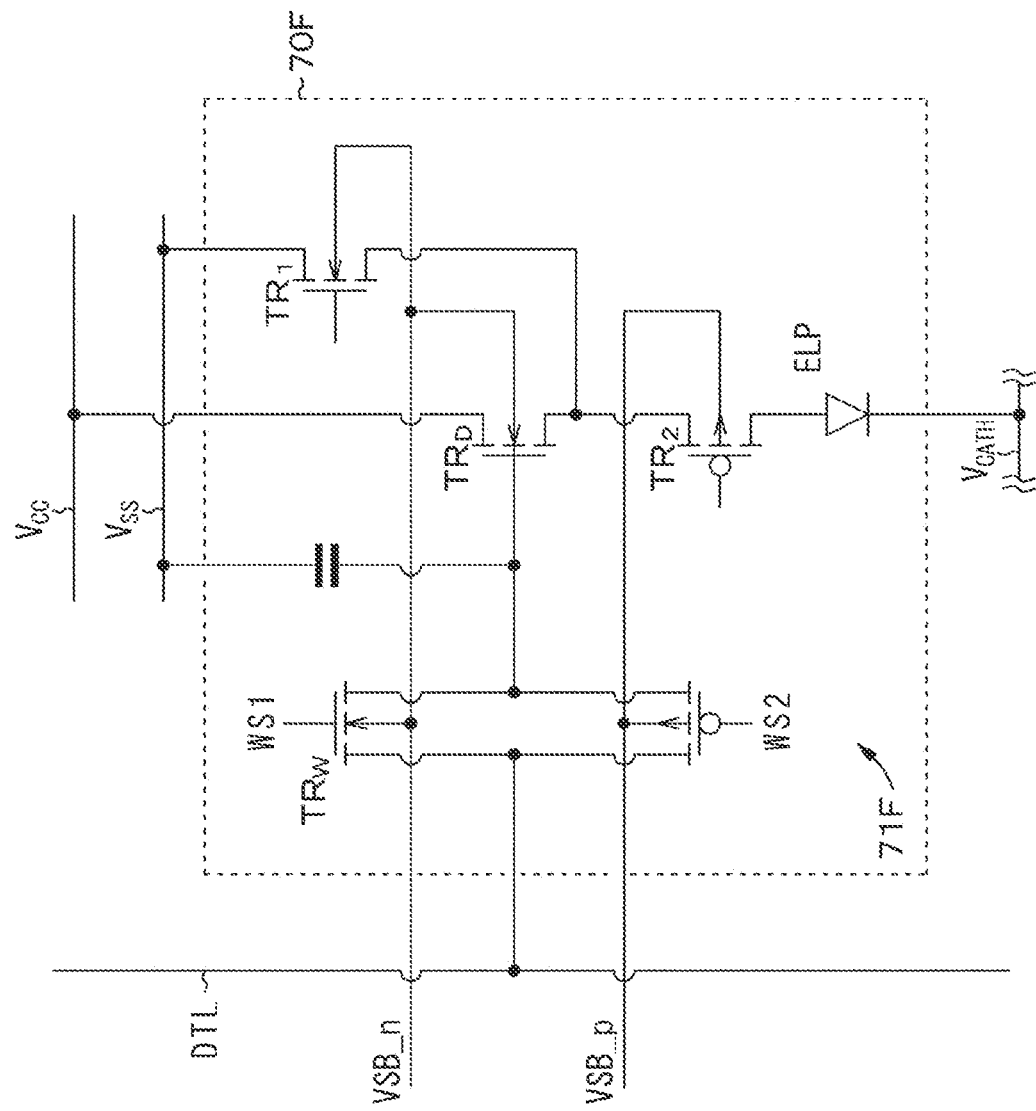
FIG. 19 is a schematic circuit diagram for illustrating a supply path of back gate voltage in a drive circuit included. In a pixel according to a sixth modification. example.

FIG. 19 is a schematic circuit diagram for illustrating a supply path of back gate voltage in a drive circuit included in a pixel according to a sixth variation.

A drive circuit of a pixel 70F illustrated in FIG. 19 includes two types of transistors having different conductivity types. A back gate line for at least the transistor of the conductivity type that constitutes the write transistor is provided. To be more specific, a back gate line corresponding to each of the two types of transistors is provided.

The pixel 70F illustrated in FIG. 19 includes a drive circuit 71F constituted by two p-channel transistors, three n-channel transistors, and one capacitor. In the example illustrated in the drawing, a voltage is supplied to both of the two p-channel transistors from a back gate line VSB_p, and a voltage is supplied to all of the three n-channel transistor from a back gate line VSB_n.

As described above, the present disclosure can be applied in any of a pixel circuit including a p-channel transistor, a pixel circuit including an n-channel transistor, and a pixel circuit including a p-channel transistor and an n-channel transistor.

[Electronic Device]

The display device according to the present disclosure as described above can be used as a display unit (a display device) in an electronic device in any field, in which a video signal input to the electronic device or a video signal generated within the electronic device is displayed as an image or video. This includes display units in, for example, television sets, digital still cameras, laptop personal computers, mobile terminal devices such as mobile phones, video cameras, head-mounted displays (displays worn on the head area), and the like.

The display device according to the present disclosure also includes a modular form having a sealed configuration. A display module formed by affixing opposing parts such as clear glass to the pixel array unit corresponds to such an example. The display module may also be provided with a circuit unit, a flexible print circuit (FPC), or the like for inputting and outputting signals and the like from the exterior to the pixel array unit. A digital still camera and a head-mounted display will be described hereinafter as specific examples of an electronic device using the display device according to the present disclosure. However, the specific examples here are merely examples, and the electronic device is not limited thereto. Specific Example 1

FIG. 20 is an exterior view of an interchangeable-lens single-lens reflex-type digital still camera, where FIG. 20A illustrates a front view thereof, and FIG. 20B illustrates a rear view thereof. The interchangeable-lens single-lens reflex-type digital still camera includes, for example, an interchangeable shooting lens unit (interchangeable lens) 412 on a right-front side, and a grip part 413 for a photographer to hold on a left-front side, of a camera body unit (camera body) 411.

A monitor 414 is provided in substantially the center of the rear side of the camera body unit 411. A viewfinder (eyepiece window) 415 is provided at the top of the monitor 414. By looking through the viewfinder 415, the photographer can see an optical image of a subject guided by the shooting lens unit 412 and decide on a composition.

In the interchangeable-lens single-lens reflex-type digital still camera configured as described above, the display device of the present disclosure can be used as the viewfinder 415. In other words, the interchangeable-lens single-lens reflex-type digital still camera according to the present example is manufactured by using the display device of the present disclosure as the viewfinder 415. The display device of the present disclosure can similarly be used for the monitor 414 disposed in the rear side.

Specific Example 2

Figure 21:
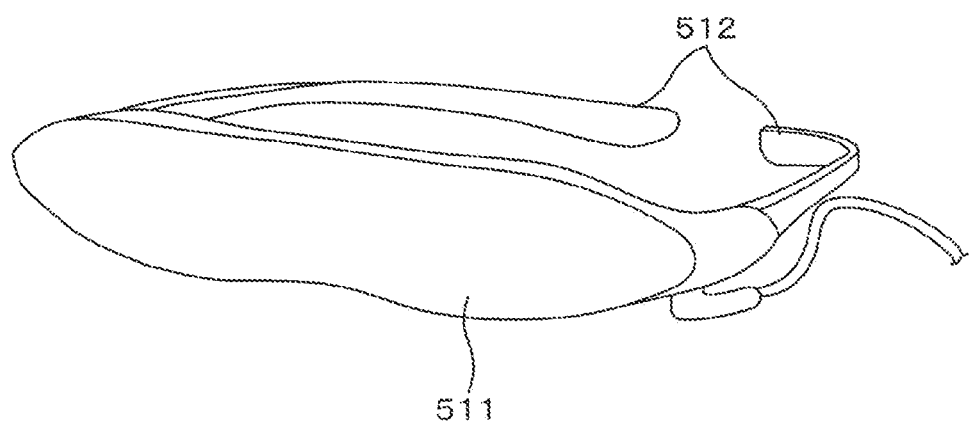
FIG. 21 is an exterior view of a head-mounted display.

FIG. 21 is an exterior view of a head-mounted display. The head-mounted display includes, for example, temple parts 512 on both sides of an eyeglasses-shaped display unit 511 for wearing the display on a user's head area. In this head-mounted display, the display device of the present disclosure can be used as the display unit 511. In other words, the head-mounted display according to the present example is manufactured by using the display device of the present disclosure as the display unit 511.

Specific Example 3

Figure 22:
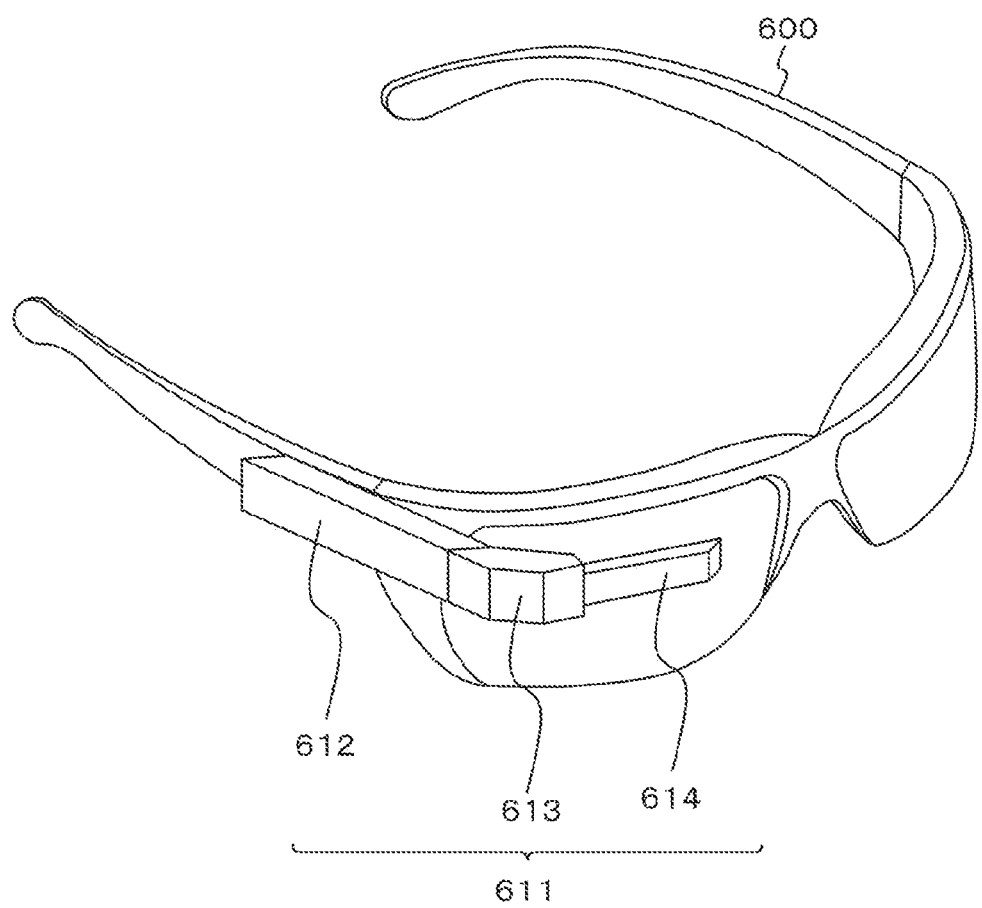
FIG. 22 is an exterior view of a see-through head-mounted display.
Figure 23:
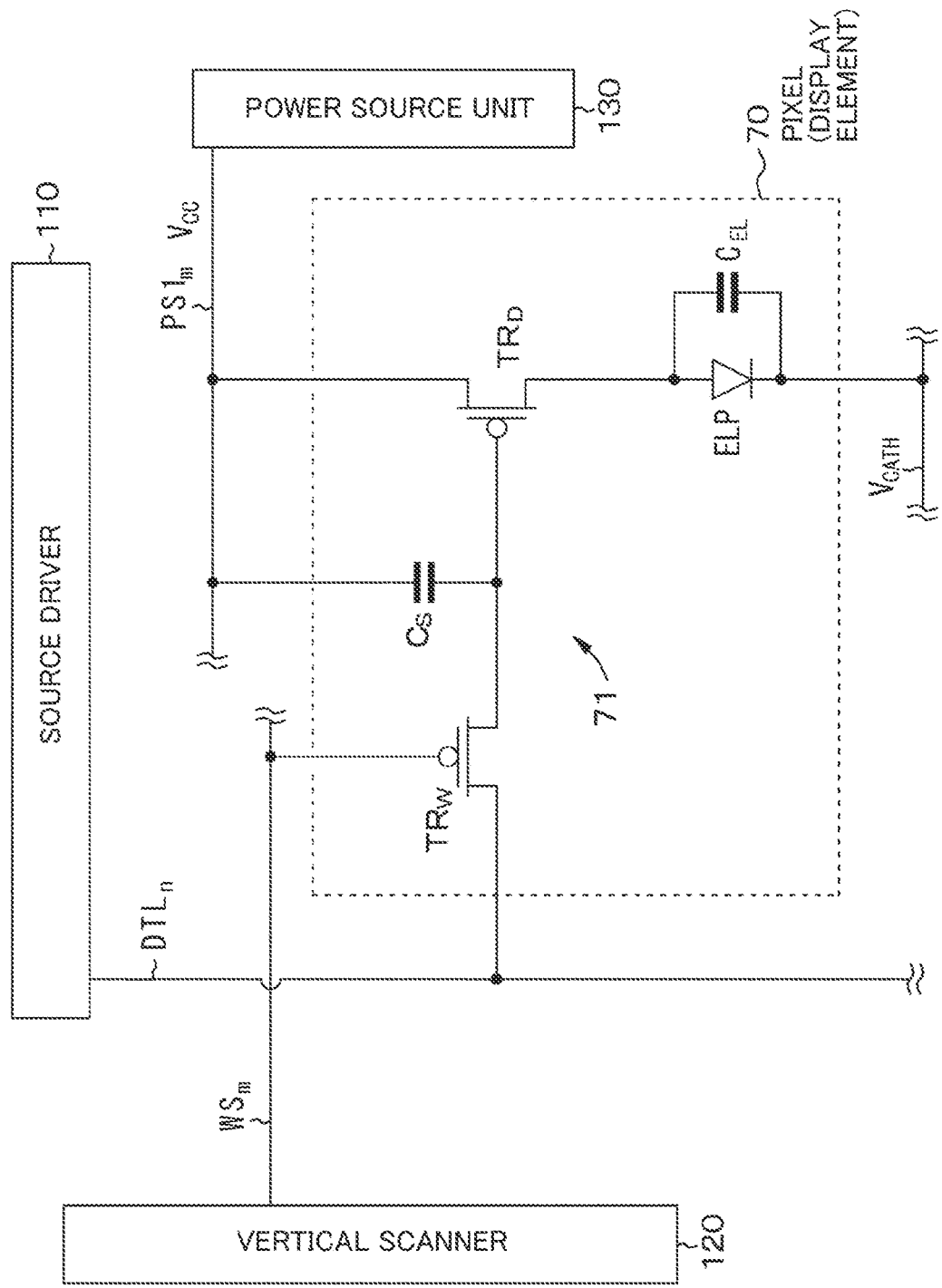
FIG. 23 illustrates an example of a circuit configuration of a pixel located in an nth row and an nth column of a display device including, as pixels, display elements in which drive circuits are configured using p-channel transistors.

FIG. 22 is an exterior view of a see-through head-mounted display. The see-through head-mounted display 611 includes a main body unit 612, an arm 613, and a lens barrel 614.

The main body unit 612 is connected to the arm 613 and eyeglasses 600. Specifically, an end of the main body unit 612 in a longer direction is coupled to the arm 613, and one side surface of the main body unit 612 is connected to the eyeglasses 600 by a connecting member. Note that the main body unit 612 may be directly attached to the head area of a person's body.

The main body unit 612 contains a control board for controlling operations of the see-through head-mounted display 611, a display unit, and the like. The arm 613 connects the main body unit 612 and the lens barrel 614, and supports the lens barrel 614. Specifically, the arm 613 is coupled to both an end part of the main body unit 612 and an end part of the lens barrel 614, and anchors the lens barrel 614. The arm 613 also contains a signal line for communicating data pertaining to images provided from the main body unit 612 to the lens barrel 614.

The lens barrel 614 projects image light provided from the main body unit 612 via the arm 613 through an ocular lens toward an eye of a user wearing the see-through head-mounted display 611. In this see-through head-mounted display 611, the display device of the present disclosure can be used as the display unit of the main body unit 612.

[Other]

Note that the technique of the present disclosure can also take on configurations such as those described below.

[A1]

A display device includes a pixel array unit in which display elements constituting pixels are arranged in a two-dimensional matrix in a row direction and a column direction, wherein each of the display elements includes a current-driven light-emitting unit and a drive circuit for driving the light-emitting unit, the drive circuit includes at least a write transistor for writing a video signal and a drive transistor for applying current to the light-emitting unit, and a voltage is supplied to a back gate of at least the write transistor via a back gate line provided separate from a power supply line that supplies a voltage to the drive transistor.

[A2]

The display device according to the foregoing [A1], wherein a constant voltage is supplied to the back gate line.

[A3]

The display device according to the foregoing [A2], wherein the write transistor is constituted by a p-channel transistor, and a same voltage as, or a different voltage from, the voltage supplied to the power supply line is supplied to the back gate line.

[A4]

The display device according to the foregoing [A3], wherein a voltage from a shared power source unit is supplied to the power supply line and the back gate line.

[A5]

The display device according to the foregoing [A3], wherein a voltage from a power source unit corresponding to the power supply line is supplied to the power supply line, and a voltage from a power source unit different from the power source unit corresponding to the power supply line is supplied to the back gate line.

[A6]

The display device according to the foregoing [A1], wherein a voltage that changes in accordance with scanning of the display element is supplied to the back gate line.

[A7]

The display device according to the foregoing [A6], wherein a voltage that is the same as a voltage supplied to a scanning line connected to a gate electrode of the write transistor is supplied to the back gate line.

[A8]

The display device according to any one of the foregoing [A1] to [A7], wherein the drive circuit includes two types of transistors having different conductivity types, and a back gate line for at least a transistor of the conductivity type constituting the write transistor is provided.

[A9]

The display device according to the foregoing [A8], wherein a back gate line corresponding to each of the two types of transistors is provided.

The display device according to any one of the foregoing [A1] to [A9], wherein the light-emitting unit is constituted by an organic electroluminescence light-emitting unit.

[B1]

An electronic device including a display device, the display device including:

a pixel array unit in which display elements constituting pixels are arranged in a two-dimensional matrix in a row direction and a column direction, wherein each of the display elements includes a current-driven light-emitting unit and a drive circuit for driving the light-emitting unit, the drive circuit includes at least a write transistor for writing a video signal and a drive transistor for applying current to the light-emitting unit, and a voltage is supplied to a back gate of at least the write transistor via a back gate line provided separate from a power supply line that supplies a voltage to the drive transistor.

[B2]

The electronic device according to the foregoing [B1], wherein a constant voltage is supplied to the back gate line.

[B3]

The electronic device according to the foregoing [B2], wherein the write transistor is constituted by a p-channel transistor, and a same voltage as, or a different voltage from, the voltage supplied to the power supply line is supplied to the back gate line.

[B4]

The electronic device according to the foregoing [B3], wherein.

a voltage from a shared power source unit is supplied to the power supply line and the back gate line.

[B5]

The electronic device according to the foregoing [B3], wherein a voltage from a power source unit corresponding to the power supply line is supplied to the power supply line, and.

a voltage from a power source unit different from the power source unit corresponding to the power supply line is supplied to the back gate line.

[B6]

The electronic device according to the foregoing [B1], wherein a voltage that, changes in accordance with scanning of the display element is supplied to the back gate line.

[B7]

The electronic device according to the foregoing [B6], wherein.

a voltage that is the same as a voltage supplied to a scanning line connected to a gate electrode of the write transistor is supplied to the back gate line.

[B8]

The electronic device according to any one of the foregoing [B1] to [B7], wherein the drive circuit includes two types of transistors having different conductivity types, and a back gate line for at least a transistor of the conductivity type constituting the write transistor is provided.

[B9]

The electronic device according to the foregoing [B8], wherein a back gate line corresponding to each of the two types of transistors is provided.

[B10]

The electronic device according to any one of the foregoing [B1] to [B9], wherein the light-emitting unit is constituted by an organic electroluminescence light-emitting unit.

REFERENCE SIGNS LIST 1, 1A, 1B, 2, 9 Display device
10 Base material
20 Semiconductor layer
n-channel well
22A Element separation region.
22B Separation region
23A, 23B, 230, 23D Source/drain region
31 Gate insulating layer
31' Insulating layer
32 Gate electrode
32' Other electrode
33 Inter-layer insulating layer
34 One electrode
35, 36, 37 Contact plug
38 Common power supply line
40 Inter-layer insulating layer
51 Anode electrode
52 Hole transport layer, light-emitting layer, and electron transport layer
53 Cathode electrode
54 Second inter-layer insulating layer
55, 56 Contact plug
60 Transparent substrate
70, 70A, 70B, 70C, 70D, 70E, 70F Display element
71, 71A, 71B, 71C, 71D, 71E, 71F Display element
80 Pixel array unit
100 Semiconductor substrate
110 Source driver
120 Vertical scanner
130 Power source unit
130A First power source unit
130B First power source unit
$TR_W$ Write transistor
$TR_D$ Drive transistor
$C_S$ Capacitance unit
ELP Organic electroluminescence light-emitting unit
$C_{EL}$ Capacitance of light-emitting unit ELP WS Scanning line
DTL Data line
PS1 Power supply line
VSB, VSB_p, VSB_n Back gate line
411 Camera body unit
412 Shooting lens unit
413 Grip part
414 Monitor
415 Viewfinder
511 Eyeglass-shaped display unit
512 Temple part
600 Eyeglasses
611 See-through head-mounted display
612 Main body unit
613 Arm
614 Lens barrel

The invention claimed is:

1. A display device comprising:
a pixel array including display elements constituting pixels arranged in a two-dimensional matrix in a row direction and a column direction, wherein
each of the display elements includes a current-driven light-emitting unit and a drive circuit for driving the light-emitting unit,
the drive circuit includes at least a write transistor for writing a video signal and a drive transistor for applying current to the light-emitting unit,
a voltage is supplied to a back gate of at least the write transistor via a back gate line provided separate from a power supply line that supplies a voltage to the drive transistor,
a constant voltage is supplied to the back gate line,
the write transistor is constituted by a p-channel transistor, and
a same voltage as, or a different voltage from, the voltage supplied to the power supply line is supplied to the back gate line.

2. The display device according to claim 1, wherein a voltage from a shared power source is supplied to the power supply line and the back gate line.

3. The display device according to claim 1, wherein a voltage from a power source corresponding to the power supply line is supplied to the power supply line, and a voltage from another power source different from the power source corresponding to the power supply line is supplied to the back gate line.

4. The display device according to claim 1, wherein the light-emitting unit is constituted by an organic electroluminescence light-emitting unit.

5. An electronic device comprising a display device according to claim 1.

6. The electronic device according to claim 5, wherein a voltage from a shared power source is supplied to the power supply line and the back gate line.

7. The electronic device according to claim 5, wherein a voltage from a power source corresponding to the power supply line is supplied to the power supply line, and a voltage from another power source different from the power source corresponding to the power supply line is supplied to the back gate line.

8. A display device comprising:
a pixel array including display elements constituting pixels arranged in a two-dimensional matrix in a row direction and a column direction, wherein
each of the display elements includes a current-driven light-emitting unit and a drive circuit for driving the light-emitting unit,
the drive circuit includes at least a write transistor for writing a video signal and a drive transistor for applying current to the light-emitting unit,
a voltage is supplied to a back gate of at least the write transistor via a back gate line provided separate from a power supply line that supplies a voltage to the drive transistor, and
a voltage that changes in accordance with scanning of the display element is supplied to the back gate line.

9. The display device according to claim 8, wherein a voltage that is the same as a voltage supplied to a scanning line connected to a gate electrode of the write transistor is supplied to the back gate line.

10. An electronic device comprising a display device according to claim 8.

11. The electronic device according to claim 10, wherein a voltage that is the same as a voltage supplied to a scanning line connected to a gate electrode of the write transistor is supplied to the back gate line.

12. A display device comprising:
a pixel array including display elements constituting pixels arranged in a two-dimensional matrix in a row direction and a column direction, wherein
each of the display elements includes a current-driven light-emitting unit and a drive circuit for driving the light-emitting unit,
the drive circuit includes at least a write transistor for writing a video signal and a drive transistor for applying current to the light-emitting unit,
a voltage is supplied to a back gate of at least the write transistor via a back gate line provided separate from a power supply line that supplies a voltage to the drive transistor,
the drive circuit includes two types of transistors having different conductivity types, and
a back gate line for at least a transistor of the conductivity type constituting the write transistor is provided.

13. The display device according to claim 12, wherein a back gate line corresponding to each of the two types of transistors is provided.

14. An electronic device comprising a display device according to claim 12.

15. The electronic device according to claim 14, wherein a back gate line corresponding to each of the two types of transistors is provided.

* * * * *